(12) United States Patent
Nakatsu et al.

(10) Patent No.: US 7,745,952 B2
(45) Date of Patent: Jun. 29, 2010

(54) ELECTRIC CIRCUIT MODULE WITH IMPROVED HEAT DISSIPATION CHARACTERISTICS USING A FIXING TOOL FOR FIXING AN ELECTRIC APPARATUS TO A HEAT SINK

(75) Inventors: Kinya Nakatsu, Hitachinaka (JP); Satoshi Ibori, Yachimata (JP); Hideki Miyazaki, Hitachi (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 443 days.

(21) Appl. No.: 11/357,115

(22) Filed: Feb. 21, 2006

(65) Prior Publication Data

US 2006/0232942 A1 Oct. 19, 2006

(30) Foreign Application Priority Data

Mar. 31, 2005 (JP) ............................. 2005-100486

(51) Int. Cl.
*H01L 23/433* (2006.01)
*H01L 23/34* (2006.01)
*H01L 23/36* (2006.01)

(52) U.S. Cl. .................. 307/9.1; 257/706; 257/718; 257/719; 257/727

(58) Field of Classification Search .................. None
See application file for complete search history.

(56) References Cited

U.S. PATENT DOCUMENTS

| 4,392,151 | A | * | 7/1983 | Iwatani ...................... 257/692 |
| 4,415,025 | A | * | 11/1983 | Horvath ...................... 165/185 |
| 5,486,720 | A | * | 1/1996 | Kierse ......................... 257/659 |
| 5,622,157 | A | * | 4/1997 | Murata ......................... 123/647 |
| 5,896,270 | A | * | 4/1999 | Tsui ............................ 361/704 |
| 6,018,193 | A | * | 1/2000 | Rubens et al. ............... 257/720 |
| 6,043,981 | A | * | 3/2000 | Markow et al. .............. 361/704 |
| 6,169,659 | B1 | * | 1/2001 | Wheaton ..................... 361/704 |
| 6,456,490 | B1 | * | 9/2002 | Lai .............................. 361/684 |
| 6,501,658 | B2 | * | 12/2002 | Pearson et al. ............... 361/709 |
| 6,587,344 | B1 | * | 7/2003 | Ross ........................... 361/704 |
| 6,890,799 | B2 | * | 5/2005 | Daikoku et al. ............. 438/122 |
| 6,906,414 | B2 | * | 6/2005 | Zhao et al. .................. 257/707 |
| 7,206,204 | B2 | * | 4/2007 | Nakatsu et al. ............. 361/703 |
| 7,215,551 | B2 | * | 5/2007 | Wang et al. ................. 361/707 |

(Continued)

FOREIGN PATENT DOCUMENTS

JP 62-47140 3/1987

(Continued)

*Primary Examiner*—Stephen W Jackson
*Assistant Examiner*—Adi Amrany
(74) *Attorney, Agent, or Firm*—Crowell & Moring LLP

(57) ABSTRACT

A power module constructs a pressurizing tool by laminating an elastic member as well as a DC positive-side wiring member and DC negative-side wiring member in which currents flow in opposite directions. The pressurizing tool presses a first fixing tool, and then the first fixing tool presses semiconductor equipment. The semiconductor equipment is fixed to a heat dissipating member with its heat dissipating surface brought into surface contact with side wall surfaces of the heat dissipating member.

The power module can enhance heat dissipation between a heat dissipating member and semiconductor equipment, and enables the semiconductor equipment to be fixed to the heat dissipating member without adding other components to the power module.

3 Claims, 16 Drawing Sheets

U.S. PATENT DOCUMENTS 7,504,720 B2 * 3/2009 Nakatsu et al. ............. 257/712
2008/0239663 A1 * 10/2008 Yamamoto et al. .......... 361/691

FOREIGN PATENT DOCUMENTS

| JP | 06-22995 | 6/1994 |
| JP | 07-3674 | 1/1995 |
| JP | 09-134985 | 5/1997 |
| JP | 2000-091485 | 3/2000 |
| JP | 2001-332670 | 11/2001 |
| JP | 2002-198477 | 7/2002 |

* cited by examiner

ELECTRIC CIRCUIT MODULE WITH IMPROVED HEAT DISSIPATION CHARACTERISTICS USING A FIXING TOOL FOR FIXING AN ELECTRIC APPARATUS TO A HEAT SINK

CLAIM OF PRIORITY

The present application claims priority from Japanese application serial no. 2005-100486, filed on Mar. 31, 2005, the content of which is hereby incorporated by reference into this application.

FIELD OF THE INVENTION

The present invention relates to an electric circuit module as well as a power converter and vehicle-mounted electric system that use the module.

BACKGROUND OF THE INVENTION

Electric equipment that generates heat by itself due to electricity which flows in it, such as semiconductor equipment that controls electrical connections between electric circuits, is disposed and fixed on a heat dissipating member. This allows the heat from the semiconductor equipment to transmit to a coolant through the heat dissipating member, cooling the semiconductor equipment. Performance demanded for cooling electric equipment varies with environments of an electric appliance in which an electric circuit module including the electric equipment is mounted. A power converter mounted in an automobile, for example, requires high performance in cooling electric equipment due to an environment for mounting in the automobile and an operation environment. Accordingly, there are a wide variety of structures for mounting electric equipment on the heat dissipating members.

As conventional structures for mounting electric equipment on a heat dissipating plate, technologies described, for example, in Patent Documents 1 to 7 are known.

In Patent Document 1, a structure in which a semiconductor device is clamped between substrate bodies formed by placing electrode patterns on insulated substrates is pressed against a cooling block by a first heat dissipating block that is pressed by a second heat dissipating block tightened with a screw so that the semiconductor equipment is pressed and fixed between the first heat dissipating block and cooling block.

In Patent Documents 2 to 7, structures for mounting electric equipment on a heat dissipating member are formed separately from a module. Of these, Patent Documents 2 to 6 describe structures that use the elastic force of a pressing member to press the electric equipment against the heat dissipating member. Patent Document 7 describes a structure that transmits the tightening force of tightening members to the pressing member so that the pressing member presses the electric equipment against the heat dissipating member.

In another structure for mounting electric equipment on a heat dissipating member, tightening members are used to directly mount the electric equipment on the heat dissipating member.

Patent Document 1: Japanese patent laid-open No. 2000-91485

Patent Document 2: Japanese patent laid-open No. Hei 09 (1997)-134985

Patent Document 3: Japanese patent laid-open No. 2001-332670

Patent Document 4: Japanese patent laid-open No. 2002-198477

Patent Document 5: Japanese utility model laid-open No. Sho 62 (1987)-47140

Patent Document 6: Japanese utility model publication No. Hei 07 (1995)-3674

Patent Document 7: Japanese utility model publication No. Hei 06 (1994)-22995

SUMMARY OF THE INVENTION

A recent problem imposed on electric appliances including electric circuit modules is to further make the electric appliances compact, inexpensive, and highly reliable. As for automobiles, for example, to make power converters including electric circuit modules compact, inexpensive, and highly reliable is an important problem. In other words, it is desired for automobiles to reduce the effect on the global environment and further increase the fuel economy. To achieve this, motor-driven vehicles or vehicle auxiliaries need to be used widely, which requires that performance for mounting power converters in vehicles be improved and prices of the power converters be lowered. Therefore, to implement compact, inexpensive, highly reliable power converters is an important problem for automobiles.

When an electric appliance has an electric circuit module that includes electric equipment that generates heat by itself due to electricity which flows in it, if the electric appliance is made compact, its heat capacity becomes large. To further make the electric appliance compact, inexpensive, and highly reliable, therefore, the cooling performance of the electric equipment needs to be further improved and the electric circuit module needs to be structured with thermal deformation of its parts taken into consideration.

When the electric equipment is directly mounted on the heat dissipating member by the tightening members as described in the background art, the difference in the pressing force among the tightening members is an obstacle to efficient, stable heat dissipation (low thermal resistance).

When a structure is pressurized between blocks by tightening a screw and fixed as in the technology disclosed in Patent Document 1, if a part of the semiconductor equipment is elongated due to thermal deformation, the elongation of the part is not impeded in a direction orthogonal to the pressing direction, but impeded in the pressing direction. When metallic members such as a screw and heat dissipating block are disposed near the structure also as in the technology disclosed in Patent Document 1, if another metallic member is disposed near the structure, there is an electrical restriction that a sufficient insulating distance must be left between the other metallic member and the screw and heat dissipating block.

As for structures in which electric equipment is pressed against a heat dissipating member by the elastic force of a pressing member as in Patent Documents 2 to 6 and structures in which the tightening force of a tightening member is transmitted to a pressing member so that the pressing member presses the electric equipment against the heat dissipating member as in Patent Document 7, further stable heat dissipation (low thermal resistance) needs to be obtained in consideration of deterioration due to the heat of the pressing member, the method of applying a force to the electric equipment, and the like. At the same time, the number of parts and assembling processes must not be increased, nor must the easiness of assembling and mounting be lowered.

The present invention provides an electric circuit module that can improve heat dissipation between a heat dissipating member and electric equipment and fix the electric equipment onto the heat dissipating member without adding another part to the electric circuit module.

The present invention also provides an electric circuit module that can improve heat dissipation between the heat dissipating member and electric equipment, keep the electric equipment fixed even when there is an adverse effect by thermal expansion and contraction caused on parts in the electric equipment in the electric equipment fixing direction, and alleviate stress caused due to the thermal expansion and contraction in the electric equipment fixing direction.

The present invention also provides an electric circuit module that can improve heat dissipation between the heat dissipating member and electric equipment, fix the electric equipment onto the heat dissipating member without adding another part to the electric circuit module, keep the electric equipment fixed even when there is an adverse effect by thermal expansion and contraction caused on parts in the electric equipment in the electric equipment fixing direction, and alleviate stress caused due to the thermal expansion and contraction in the electric equipment fixing direction.

When the above electric circuit module is provided, it is preferable that parts can be disposed in the module without being subject to electrical restrictions.

When the above electric circuit module is provided, it is preferable that loss due to inductance in the module can be reduced.

When the above electric circuit module is provided, it is preferable that the module can be assembled more easily.

The present invention fixes electric equipment that includes electric circuit parts packed by a packing material and a plurality of wiring members electrically connected to the electric circuit parts by using pressurizing tools and fixing tools to press the electric equipment against a heat dissipating member in such a way that a heat dissipating surface touches the surface of the heat dissipating member, the wiring members extending from the inside of the packing material to the outside.

A feature of the present invention is that the pressurizing tool that presses the fixing tool comprises a conductive member that is electrically connected to the electric equipment and an insulating material that is made of an elastic material with an electric insulation property and electrically insulates the conductive material, or that the pressurizing tool comprises a laminate member with elasticity so that the pressurizing tool can maintain the pressing force for the fixing tool and follow the thermal expansion and contraction of the heat dissipating member, electric equipment, or fixing tool in the pressing direction.

In the present invention, the fixing tool is pressed by the pressurizing tool and then the electric equipment is pressed by the fixing tool. The heat dissipating surface of the electric equipment is then pressed against the surface of the heat dissipating member and brought into surface contact with the surface of the heat dissipating member. Accordingly, the present invention reduces and stabilizes the thermal resistance between the heat dissipating member and electric equipment.

In the present invention, the elastic force of the insulating material that electrically insulates the conductive member electrically connected to the electric equipment is transmitted to the conductive member to cause the conductive member to press the fixing tool. In this way, a member in the electric circuit also functions as a pressing tool. Therefore, the present invention enables the shared use of a module part.

In the present invention, the laminate member comprising an elastic member and metallic member constitutes the pressurizing tool of the fixing tool, which enables the pressurizing tool to be elastic. If the heat dissipating member, electric equipment, or fixing tool causes thermal expansion or contraction in the electric equipment fixing direction (or the electric equipment pressing direction), the laminate member follows the thermal expansion or contraction and expands or contracts while maintaining the force to press the fixing tool.

The present invention further provides a power converter in which the electric circuit module described above is mounted as a converting unit that is electrically connected between a power supplying source and power receiving destination; the converting unit receives power from the power supplying source, converts the received power to prescribed power, and supplies the converted power to the power receiving destination.

The present invention further provides a vehicle-mounted electric system that includes the above power converter as a controller that controls the driving of electric appliances.

As described above, the present invention can improve heat dissipation between the heat dissipating member and electric equipment because the thermal resistance between the heat dissipating member and electric equipment is reduced and stabilized. Therefore, the present invention can make the electric circuit module compact.

Since the present invention enables the shared use of parts in the module, the present invention can fix the electric equipment onto the heat dissipating member without a new module part. Therefore, the present invention can reduce the cost of the electric circuit module.

If a module part causes thermal expansion and contraction, the laminate member follows the thermal expansion and contraction, and expands and contracts while maintaining the force to press the fixing tool, according to the present invention. The electric equipment can be thus left fixed and the stress caused by the thermal expansion and contraction in the electric equipment fixing direction can be abbreviated even if an adverse effect by the thermal expansion and contraction caused on the module part arises in the electric equipment fixing direction. Therefore, the present invention can make the electric circuit module highly reliable.

The present invention further provides a power converter in which the electric circuit module described above is mounted as a converting unit that is electrically connected between a power supplying source and power receiving destination; the converting unit receives power from the power supplying source, converts the received power to prescribed power, and supplies the converted power to the power receiving destination.

The present invention further provides a vehicle-mounted electric system that includes the above power converter as a controller that controls the driving of electric appliances.

BRIEF DESCRIPTION OF THE DRAWINGS

FIG. 6A is a front view and FIG. 6B is a side view.

DESCRIPTION OF THE PREFERRED EMBODIMENTS

Embodiments of the present invention will be described below in detail with reference to the drawings.

In the embodiments described below, a vehicle-mounted inverter particularly subject to a strict thermal cycle and operation environment is used as an exemplary power converter in which the inventive electric circuit module is mounted. The vehicle-mounted inverter is included in a vehicle-mounted electric system as a controller that controls the driving of a vehicle-mounted motor; the vehicle-mounted inverter receives direct current power supplied from a vehicle-mounted battery that constitutes a vehicle-mounted power supply, converts the received direct current to prescribed alternate current, and supplies the obtained alternate current to the vehicle-mounted motor to control the driving of the vehicle-mounted motor.

The structure described below can also be applied to a power module that constitutes a power converting section in a DC-DC power converter such as DC/DC converter or DC chopper or in an AC-DC power converter.

The structure described below can also be applied to a power module that constitutes a power converting section in a power converter mounted in an industrial electric system such as a motor-driven system in a factory. Another application of the structure is a power converter mounted in a household electric system such as a solar electric power generating system or motor-driven system for home use.

Embodiment 1

A first embodiment of the present invention will be described with reference to FIGS. 1 to 8.

First, a hybrid electric vehicle in this embodiment will be described by using FIG. 8.

Figure 8:
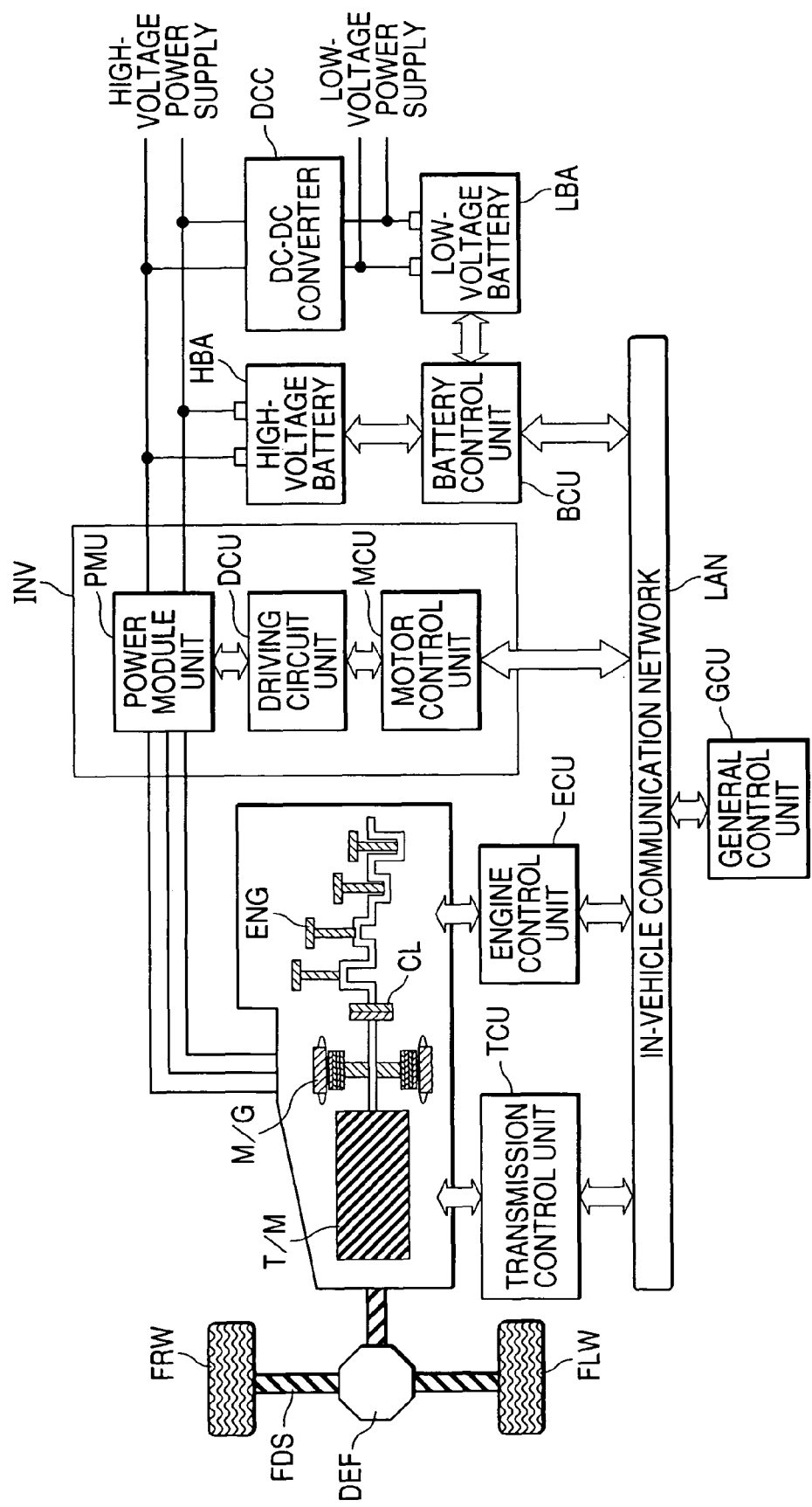
FIG. 8 is a block diagram schematically indicating the structure of a power system of a hybrid vehicle in which the inverter shown in FIG. 1 is mounted as a control unit of a motor driving system.

FIG. 8 is a schematic diagram showing the structure of the power system of the hybrid electric vehicle in this embodiment.

The hybrid electric vehicle (referred to below as HEV) in this embodiment is one kind of electric vehicle and has two power systems: one of the power systems is an engine system that uses an engine ENG, which is an internal combustion engine, as an power source, the engine system being mainly used as the driving source of the HEV; the other is a vehicle-mounted electric system that uses a motor generator M/G as another power source. The vehicle-mounted electric system is mainly used as the driving source of the HEV and the electricity generating source of the HEV.

Front driving shaft FDSs are rotatably secured to the front of the body (not shown). A pair of front wheels, front left wheel FLW and front right wheel FRW, are provided at diametrically opposite ends of the FDSs. At the rear of the body (not shown), a rear driving shaft provided with a pair of rear wheels at both ends is rotatably secured.

The HEV in this embodiment uses the front-drive system. For this reason, a differential gear DEF is provided at the center of the front driving shaft FDSs. The output side of the differential gear DEF is mechanically connected to the front driving shaft FDSs. The output side of a transmission T/M is mechanically connected to the input side of the differential gear DEF. The differential gear DEF is a power distributing mechanism, which distributes the rotational driving force transmitted from the transmission T/M to the right and left front driving shafts FDSs. The transmission T/M is a power transmitting mechanism, which changes the speed of the rotational driving force transmitted to the transmission T/M and transmits the changed force to the differential gear DEF. The rotational driving force transmitted to the transmission T/M is the force transmitted from the engine ENG and motor generator M/G.

The engine ENG includes a plurality of components such as an injector, slot valve, ignition unit, and intake/exhaust valves (all of which are not shown). The injector is a fuel injection valve for controlling the amount of fuel to be supplied by being injected into the cylinder of the engine ENG. The slot valve is a throttle valve for controlling the amount of air to be supplied into the cylinder of the engine ENG. The ignition unit is a fire source for supplying a spark to burn the mixture in the cylinder of the engine ENG. The intake/exhaust valves are open/close valves provided on the intake side and exhaust side of the cylinder of the engine ENG; the timings of opening and closing the intake/exhaust valves are controlled according to the operation cycle of the engine ENG.

The components are controlled by an engine control unit ECU. The engine control unit ECU calculates control signals (control values) required to operate the components from command signals (commanded values) output from a high-level control unit, output signals (parameter values) sent from sensors and another control unit, and data and maps stored in a storage device in advance. The calculated control signals (control values) are output to the driving units of the components. The operations of the components are thus controlled, which controls the operation of the engine ENG.

The transmission T/M is provided with a gearbox mechanism. The gearbox mechanism comprises a plurality of gears; it changes the transmission paths of gears that transmit the rotational driving force from the input axis to the output axis according to the operation state of the vehicle to obtain a plurality of gear ratios. The gearbox mechanism is controlled by a transmission control unit TCU; the transmission control unit TCU calculates control signals (control values) required to operate the gearbox mechanism from command signals (commanded values) output from a high-level control unit, output signals (parameter values) from sensors and another control unit, and data and maps stored in a storage device in advance. The calculated control signals (control values) are output to the driving unit of the gearbox mechanism. The operation of the gearbox mechanism is thus controlled, which controls the operation of the transmission T/M.

The motor generator M/G is disposed between the engine ENG and transmission T/M in the engine room that is disposed in the front of the vehicle. One end of the rotational shaft of a rotor of the motor generator M/G is mechanically linked to the input axis of the transmission T/M; the other end is mechanically linked to the crankshaft of the engine ENG through a clutch CL.

When the vehicle is in a powering mode by the motor generator M/G and a regeneration mode by the motor generator M/G, the clutch CL is disengaged and only the motor generator M/G is mechanically connected to the transmission T/M. This transmits the rotational driving force of the motor generator M/G to the transmission T/M. When the vehicle is in a powering mode by both the engine ENG and motor generator M/G, the clutch CL is engaged and both the engine ENG and motor generator M/G are mechanically connected to the transmission T/M. This transmits the rotational driving forces of both the engine ENG and motor generator M/G to the transmission T/M. When the vehicle is in a powering mode by the engine ENG, the clutch CL is engaged and both the engine ENG and motor generator M/G are mechanically connected to the transmission T/M. This transmits the rotational driving force of the engine ENG to the transmission T/M. In this state, the motor generator M/G rotates together.

If the engine ENG starts while in the powering mode by the motor generator M/G, that is, the engine ENG is started while it is running, the clutch CL is engaged while it is sliding, mechanically interconnecting the engine ENG and motor generator M/G. This transmits part of the rotational driving force of the motor generator M/G to the engine ENG through the clutch CL.

The motor generator M/G uses a permanent magnetic AC synchronous machine. The motor generator M/G is equipped with a stator and a rotor that is rotatably disposed on the inner periphery side of the stator through a hollow. The stator is formed by applying distributed winding or concentrated winding to the three-phase winding constituting the stator winding in a plurality of slots formed in the iron core of the stator; in the distributing winding, the two sides of winding is accommodated in two slots separated from each other by several slots; in the concentrated winding, wires are wound around a tooth formed between adjacent slots and the two sides are accommodated in the adjacent slots. The rotor is formed by embedding a plurality of permanent magnets inside the outer periphery of the iron core of the rotor. The motor generator M/G in this embodiment causes torque by the magnetic flux of the permanent magnets and reluctance torque by the magnetic flux that passes a magnetic part (auxiliary magnetic pole) formed between adjacent permanent magnets having different poles. The torque obtained by combining these torques is output to the transmission T/M as a rotational driving force.

The operation of the motor generator M/G is controlled by an inverter INV. Three-phase AC power from the inverter INV is supplied to the three-phase stator windings of the stator. The stator then generates a rotational magnetic field. The three-phase AC power supplied to the stator windings is controlled by the inverter INV so that a composite vector of an electromotive force of the stator, which is generated by a current supplied to the stator windings, faces in the rotational direction with respect to the central position of an auxiliary magnetic pole of the rotor. Upon the occurrence of the rotational magnetic field around the stator, the rotor receives a torque caused by the magnetic flux of the permanent magnets and a reluctance torque caused by the magnetic flux that passes through the auxiliary magnetic pole. The rotor then generates a rotational driving force according to the three-phase AC power. That is, the motor generator M/G operates as the motor.

The motor generator M/G receives the kinetic energy of the vehicle through the transmission T/M and operates as the motor. When the rotor rotates, the magnetic flux of the permanent magnets is linked with the stator windings and an electromotive force is induced. This causes the stator to generate three-phase AC power according to the number of revolutions of the rotor. That is, the motor generator M/G operates as the motor. The generated three-phase AC power is supplied to the inverter INV. The inverter INV converts the three-phase AC power into DC power. The converted DC power is supplied to a high-voltage battery HBA and stored therein.

The inverter INV is a power converting apparatus that converts the DC power supplied from the high-voltage battery HBA to three-phase AC power. The inverter INV includes a power module unit PMU, driving circuit unit DCU, and motor control unit MCU.

The power module unit PMU constitutes the main converting circuit in the inverter INV; it comprises a plurality of power semiconductor devices. The motor control unit MCU constitutes a control unit of the inverter INV; it calculates control signals (control values) required to switch the plurality of power semiconductor devices on and off from command signals (commanded values) output from a high-level control unit, output signals (parameter values) from sensors and another control unit, and data and maps stored in a storage device in advance. The calculated control signals (control values) are output to the driving circuit unit DCU. The driving circuit unit DCU constitutes the driving unit of the inverter INV; it generates driving signals required to switch the plurality of power semiconductor devices according to control signals (control values) output from the motor control unit MCU. The generated driving signals are output to the power module unit PMU.

The power supply system of the HEV comprises two power supplies, high-voltage power supply and low-voltage power supply. The high-voltage power supply is used as the power supply for the motor generator M/G; it has a high-voltage battery HBA with a nominal output voltage of 200 V to 350 V. The low-voltage power supply is used as the power supply of the starter that starts the engine ENG, vehicle-mounted auxiliary devices such as a radio and lights, the engine control unit ECU, the transmission control unit TCU, the motor control unit MCU, the battery control unit BCU, general control unit GCU, and other control units; it has a low-voltage battery BA2 with a nominal output voltage of 12 V.

The high-voltage battery HBA (high-voltage power supply) is electrically connected to the input (DC) side of the inverter INV. This enables the high-voltage battery HBA (high-voltage power supply) and inverter INV to mutually send and receive the DC power. When the motor generator M/G is operated as the motor, the DC power stored in the high-voltage battery HBA (high-voltage power supply) is supplied to the inverter INV and then converted to three-phase AC power. When the motor generator M/G is operated as the engine, the DC power output from the inverter INV is supplied to an electric high-voltage load and consumed as driving power; at the same time, the DC power is supplied to the high-voltage battery HBA and stored therein.

The low-voltage battery LBA (low-voltage power supply) is electrically connected to the high-voltage battery HBA (high-voltage power supply) through a bi-directional DC-DC converter DCC. This enables the low-voltage battery LBA (low-voltage power supply) and the high-voltage battery HBA (high-voltage power supply) to change the voltage level of the DC power and mutually send and receive the changed DC power. When low-voltage DC power is supplied to an electric low-voltage load, if the low-voltage LBA is charged, the DC-DC converter DCC drops the voltage of the DC power supplied from the high-voltage battery HBA (high-voltage power supply) and supplies the DC power to the low-voltage battery LBA (low-voltage power supply). If there is a need to back up the high-voltage battery HBA (high-voltage power supply), the DC-DC converter DCC boosts the voltage of the DC power supplied from the low-voltage battery LBA (low-voltage power supply) and supplies the DC power to the high-voltage battery HBA (high-voltage power supply).

The charging and discharging of the high-voltage battery HBA and low-voltage battery LBA are controlled by the battery control unit BCU. Their lives and the like are also managed. For the purpose of charge and discharge control of the batteries and life management, the voltage and current values and other data of the high-voltage battery HBA and low-voltage battery LBA are input to the battery control unit BCU.

The DC-DC converter DCC includes a semiconductor module, reactor, and driving circuit unit (all of which are not shown). The semiconductor module constitutes a switching section in a DC power voltage boosting and dropping circuit in the DC-DC converter DCC; the semiconductor module has a plurality of switching semiconductor devices. The reactor is a magnetic device that constitutes an electromagnetic energy storing section in the voltage boosting and dropping circuit; the reactor is formed by winding two wires around a circular magnetic core. The driving circuit unit constitutes a driving section of the DC-DC converter DCC; the driving circuit unit generates driving signals that switch on and off the plurality of switching devices, according to control signals (control values) output from a control unit (not shown). The driving signals are input to the power semiconductor devices in the module. The control unit that outputs the control signals to the driving circuit unit is included in the DC-DC converter DCC or battery control unit BCU.

The engine control unit ECU, transmission control unit TCU, motor control unit MCU, and BCU are interconnected through an in-vehicle communication network LAN. The general control unit GCU is also connected to the in-vehicle communication network LAN. Accordingly, bi-directional signal transmission becomes possible between control units, enabling mutual information transfer and the sharing of detected values.

The general control unit GCU outputs command signals to the control units according to the operation status of the vehicle. For example, the general control unit GCU calculates the amount of torque necessary for the vehicle according to the amount of gas pedal displacement responsive to an acceleration request by a driver, and divides the necessary amount of torque into an output torque value on the engine ENG side and an output torque value on the motor generator M/G side so that the operation efficiency of the engine ENG is improved. The divided output torque value on the engine ENG side is output to the engine control unit ECU as an engine torque command signal, while the divided output torque value on the motor generator M/G side is output to the motor control unit MCU as a motor torque command signal.

The HEV in this embodiment has a plurality of operation modes. The operations of the two power systems are controlled according to the operation modes.

When the vehicle starts or is running at low speed (in a range in which the efficiency of the engine ENG is low) or under a light load (during running at low speed to medium speed), the powering mode for using the motor generator M/G as a driving source to drive the vehicle is entered. In this case, the DC voltage supplied from the high-voltage battery HBA is converted by the inverter INV to prescribed three-phase AC power and then supplied to the motor generator M/G. The motor generator M/G then operates as the motor and outputs rotational driving power according to the torque requested by the vehicle. At this time, the engine ENG is separated from the clutch CL from the driving system.

When the vehicle is running at medium speed (in a range in which the efficiency of the engine ENG is high) to high speed (in a range in which the air-fuel ratio of the engine ENG is handled as being theoretical) or at high speed, the powering mode for using the engine ENG as a driving source to drive the vehicle is entered. In this case, the engine control unit ECU controls the operation of a plurality of components of the engine ENG and outputs rotational driving power according to the torque requested by the vehicle. The driving force is transferred to the transmission T/M through the motor generator M/G. In this case, the motor generator M/G is rotated together with the engine ENG. Therefore, the motor generator M/G can be operated as the motor to generate power, or power generation can be suppressed. Another motor may be provided separately to have it generate power.

When the vehicle runs under a high load such as acceleration, the powering mode for using both the engine ENG and motor generator M/G as the driving source to drive the vehicle is entered. In this case, operation is performed as if the two modes described above were combined; rotational power according to the torque requested by the vehicle is shared by the engine ENG and motor generator M/G and output from them so that the operation efficiency of the engine ENG is increased.

When the vehicle speed is reduced or braking is applied, the regeneration mode for operating the motor generator M/G as the motor to have it generate power is entered. In this case, the inverter INV converts the three-phase AC power generated by the motor generator M/G into prescribed DC power and supplies the DC power to the high-voltage battery HBA. The DC power supplied from the inverter INV is then stored in the high-voltage battery HBA. This operation is the same as the operation when power is generated while in the powering mode by the engine ENG.

Next, the electric circuit structure of the inverter INV in this embodiment will be described with reference to FIG. 7.

Figure 7:
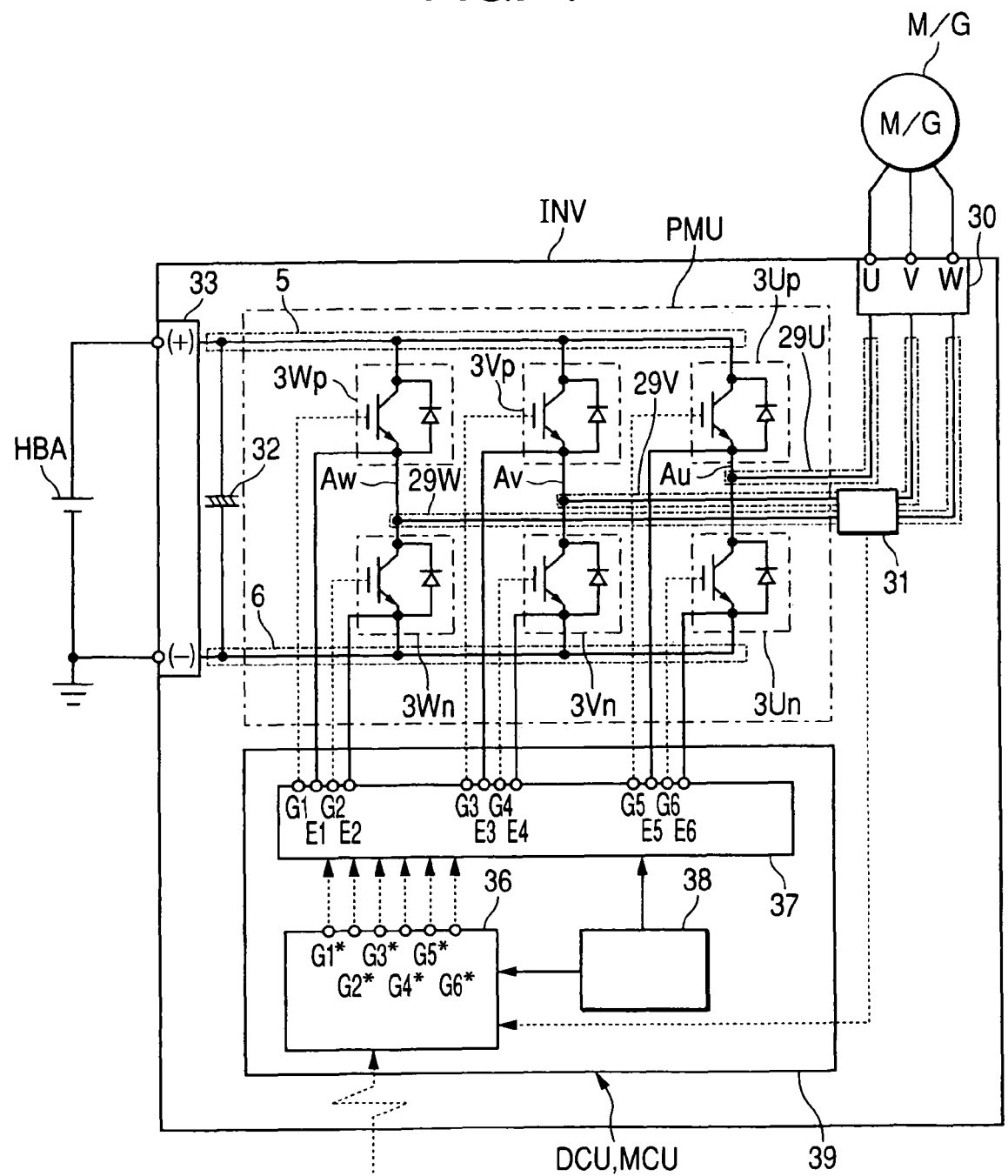
FIG. 7 is a schematic circuit diagram indicating the circuit structure of the inverter shown in FIG. 1.

FIG. 7 shows the electric circuit structure of the inverter INV in this embodiment.

The inverter INV comprises a power module unit PMU, driving circuit unit DCU, and motor control unit MCU.

In this embodiment, the power system and signal system are indicated by solid lines and dash-dot lines, respectively, so that they can be distinguished easily.

The PMU constitutes the main circuit (converter) for power conversion; it operates upon reception of a driving signal output from the driving circuit unit DCU to covert DC power supplied from the high-voltage HBA to three-phase AC power and supplies the AC power to the stator windings of the motor generator M/G. The main circuit is a three-phase bridge circuit in which series circuits for three phases are electrically connected in parallel between the positive and negative sides of the high-voltage battery HBA.

Each series circuit is also referred to as an arm. The power semiconductor device in the upper arm is electrically connected to the power semiconductor device in the lower arm in series. In this embodiment, an insulated gate bipolar transistor (IGBT), which is a switching semiconductor device, is used as the power semiconductor device. The IGBT has three electrodes, that is, a collector electrode, emitter electrode, and gate electrode. A diode is electrically connected between the collector electrode and emitter electrode of the IGBT. The diode has two electrodes, that is, a cathode electrode and anode electrode. The cathode electrode is electrically connected to the collector electrode of the IGBT and anode electrode is electrically to the emitter electrode of the IGBT so that the direction from the emitter electrode of the IGBT to the collector becomes the forward direction.

The power semiconductor may be a metal oxide semiconductor field-effect transistor (MOSFET). The MOSFET has three electrodes, that is, a drain electrode, source electrode, and gate electrode. The MOSFET has a parasitic diode between the source electrode and drain electrode by which the direction from the drain electrode to the source electrode becomes the forward direction, so there is no need to provide a diode separately as in the IGBT.

The u-phase arm Au is formed by electrically connecting the source electrode of the power semiconductor device 3Up to the drain electrode of the power semiconductor device 3Un in series. The v-phase arm Av and w-phase arm Aw are also formed in the same way as the u-phase arm Au; the source electrodes of the power semiconductor devices 3Vp and 3Wp are electrically connected to the drain electrodes of the power semiconductor devices 3Vn and 3Wn in series, respectively.

The drain electrodes of the power semiconductor devices 3Up, 3Vp, and 3Wp are electrically connected to the high-potential side (positive electrode side) of the high-voltage battery HBA through a DC (input) positive-side wiring member 5 and a DC (input) terminal block 33. The source electrodes of the power semiconductor devices 3Un, 3Vn, and 3Wn are electrically connected to the low-potential side (negative electrode side) of the high-voltage battery HBA through a DC (input) negative-side wiring member 6 and the DC (input) terminal block 33.

The midpoint (part connected between the source electrode of the power semiconductor device 3Up in the upper arm and the drain electrode of the power semiconductor device 3Un in the lower arm) of the u-phase arm Au is electrically connected to the winding of the u-phase stator of the motor generator M/G through an AC (output) U-phase wiring member 29U and AC (output) terminal block 30. The midpoints of the v-phase arm Av and w-phase arm Aw are also electrically connected to the respective windings of the v-phase and w-phase stators of the motor generator M/G through v-phase and w-phase wiring members 29V and 29W and the AC (output) terminal block 30, in the same way as the midpoint of the u-phase arm Au.

An electrolytic capacitor 32 for smoothing is electrically connected between the positive and negative sides of the high-voltage battery HBA to suppress DC voltage fluctuations that are caused by the operation of the power semiconductor devices.

The driving circuit unit DCU constitutes the driving section of the inverter INV. The motor control unit MCU constitutes the control section of the inverter INV. A combination of the driving circuit unit DCU and motor control unit MCU is sometimes referred to as a control section.

The driving circuit unit DCU has a driving circuit 37 that outputs driving signals for driving the power semiconductors 3Up to 3Wn from the terminals G1 to G6 to the gate electrodes of the corresponding power semiconductors 3Up to 3Wn. The driving circuit 37 is a so-called 6-in-1 type integrated circuit (IC) formed by integrating a plurality of circuits corresponding to the upper and lower arms of a phases into one circuit; the driving circuit is mounted on a control circuit board 39. An interface circuit, gate circuit, error detection, and the like are provided in correspondence to the upper and lower arms of each phase. The circuits on the driving circuit 37 provided in correspondence to the upper and lower arms of each phase operate on a voltage (13 VDC, for example) applied by an insulated power supply 38, relative to the potential of the source electrodes of the corresponding power semiconductor devices 3Up to 3Wn. For this reason, the ground terminals E1 to E6 in the driving circuit 37 are electrically connected to the source electrodes of the corresponding power semiconductor devices 3Up to 3Wn. The reference potential of the lower arm of each phase is the ground potential.

The motor control unit MCU has a microcomputer 36 that calculates control values used to operate the power semiconductor devices in the PMU from a plurality of input signals entered and then outputs the calculated values to the driving circuit unit DCU as control signals. The microcomputer 36 operates on a voltage (5 VDC, for example) applied by the insulated power supply 38, relative to the ground potential. The microcomputer 36 is mounted on the control circuit board 39 together with the driving circuit 37.

The microcomputer 36 receives torque command signals (torque command values) and detection signals (current values) as input signals. The torque command signals (torque command values) are output from the general control unit GCU according to the operation mode of the vehicle. The detection signals (current values) are output from a current sensor 31. The current sensor 31 comprises a shunt resistor or current transformer (CT) and other elements; the current sensor detects v-phase and w-phase currents that are supplied from the PMU to the stator windings of the motor generator M/G.

The microcomputer 36 calculates current command values Id* and Iq* of the d and q axes from input signals and then calculates voltage control values Vu to Vw from the calculated current command values Id* to Iq*. The microcomputer then outputs the calculated voltage control values Vu to Vw from terminals G1* to G6* to the driving circuit 37, the voltage control values being used as control signals (power width modulation (PWN) signals) Vpu* to Vnw* to operate the power semiconductor devices in the PMU.

The insulated power supply 38 is the operation power supply for the driving circuit 37 and microcomputer 36; the insulated power supply has a transformer. A primary side (high-voltage side) of the insulated power supply 38 is electrically connected to the low-voltage LBA. A secondary side (low-voltage side) of the insulated power supply 38 is structured so that a plurality of different voltages can be output; the secondary side is electrically connected to the driving circuit 37 and microcomputer 36. The power terminal in the driving circuit 37 receives a DC voltage of, for example, 13 VDC from the secondary side (low-voltage side) of the insulated power supply 38, while the power terminal in the microcomputer 36 receives a DC voltage of, for example, 5 VDC from the secondary side (low-voltage side) of the insulated power supply 38; these voltages are used as operation voltages.

Next, the structure of an actual inverter INV to which the circuit structure of the inverter INV described above is applied will be described with reference to FIGS. 1 to 6.

Figure 1:
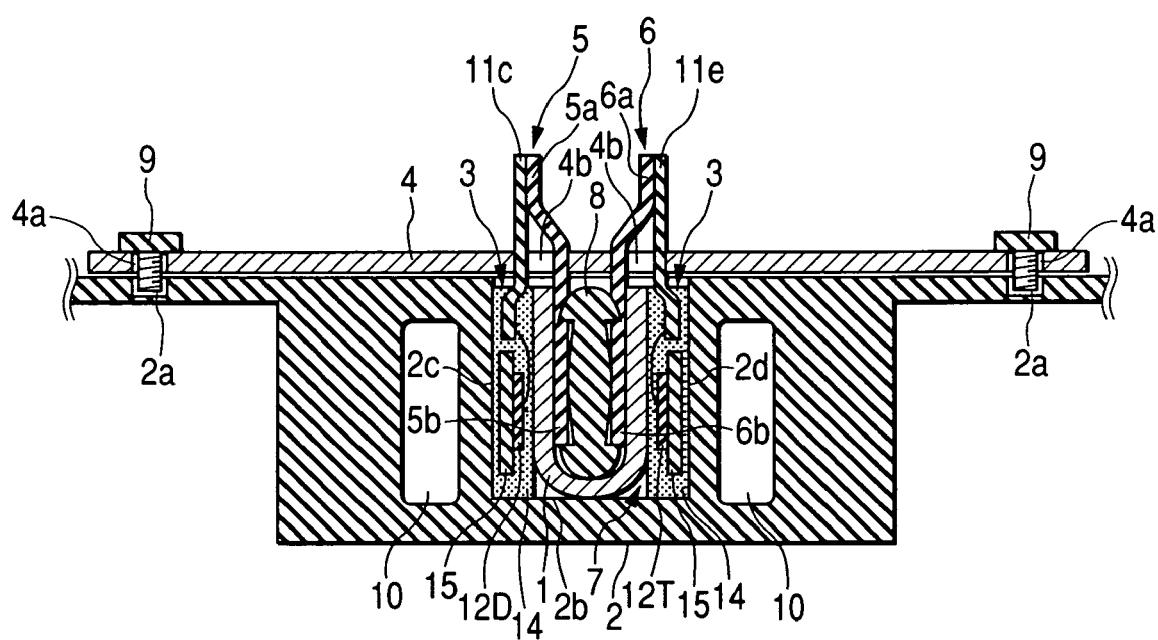
FIG. 1 is a cross-sectional view indicating the structure of a power module in an inverter that is a first embodiment of the present invention.
Figure 2:
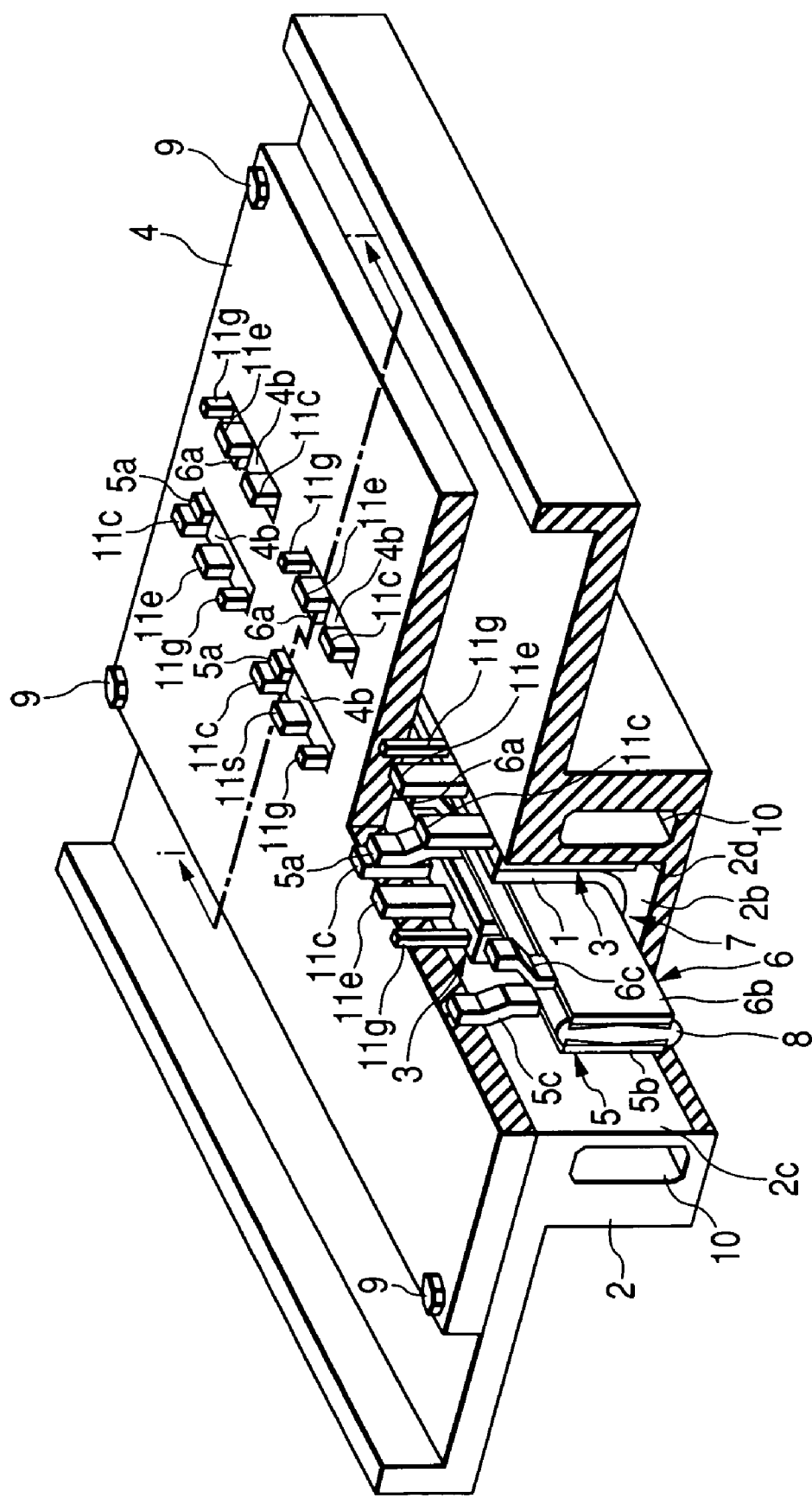
FIG. 2 is a perspective view in which part of the power module structure shown in FIG. 1 is cut.
Figure 3:
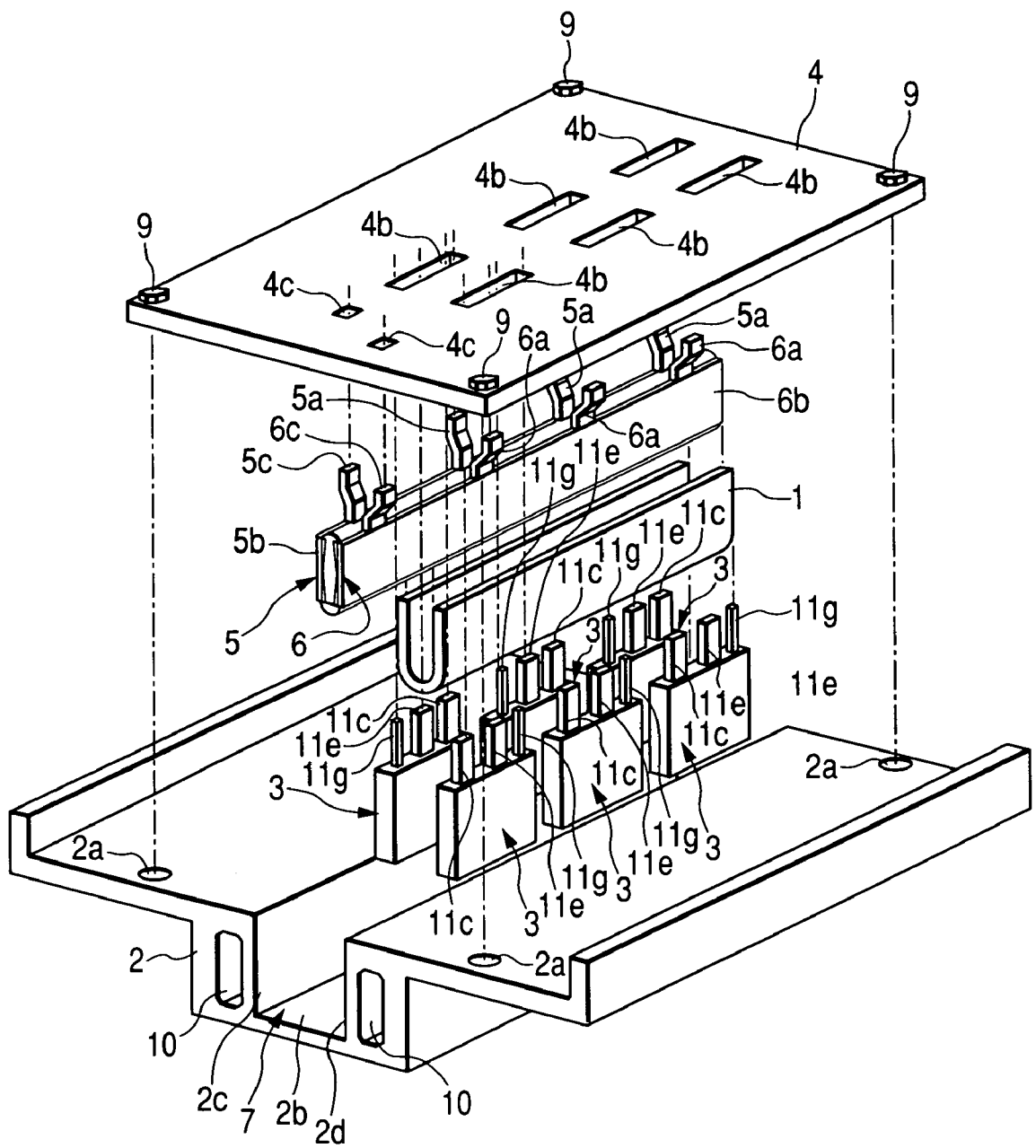
FIG. 3 is an exploded perspective view indicating the power module structure shown in FIG. 1.
Figure 4:
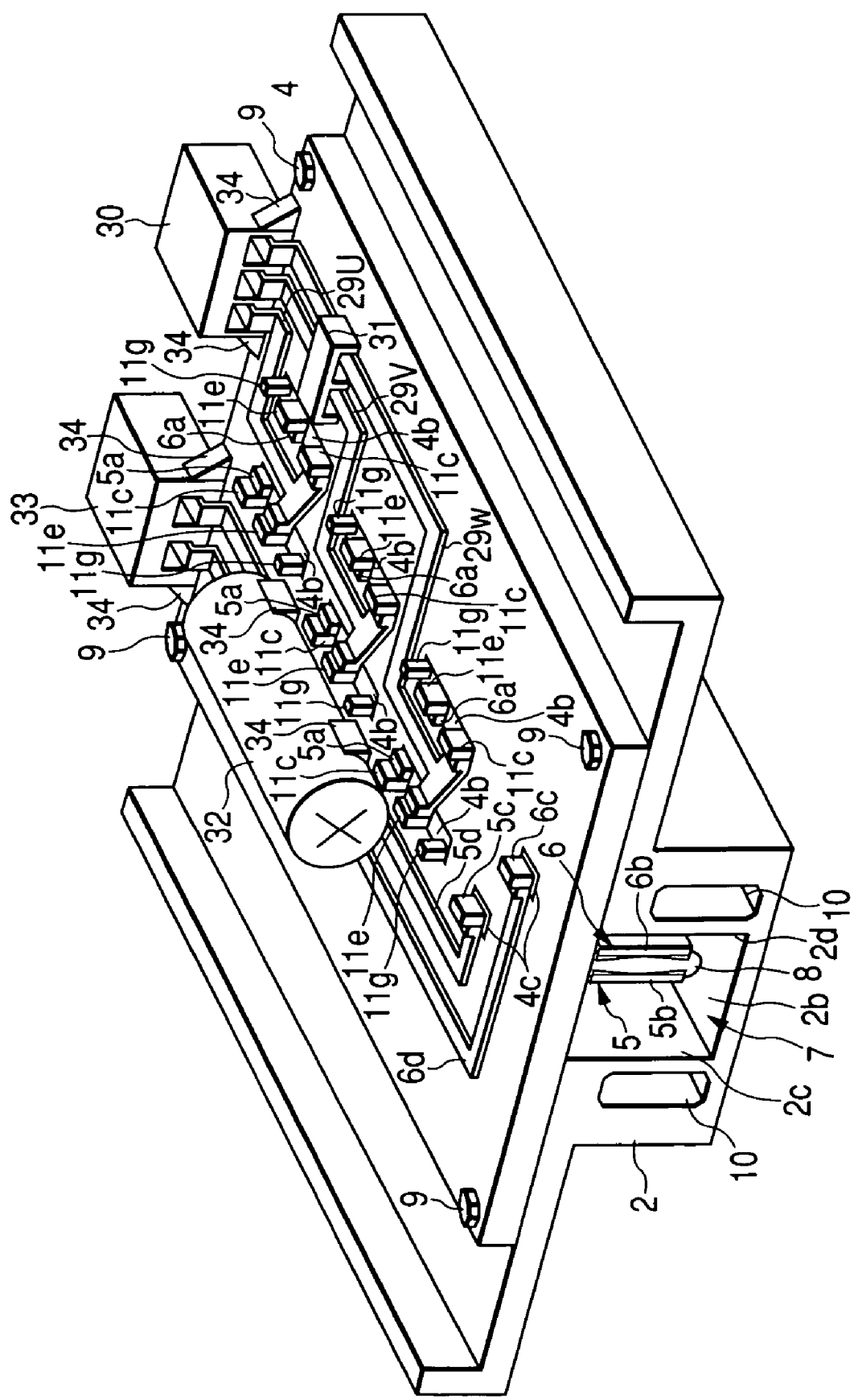
FIG. 4 is a perspective view indicating the power module structure shown in FIG. 1.
Figure 5:
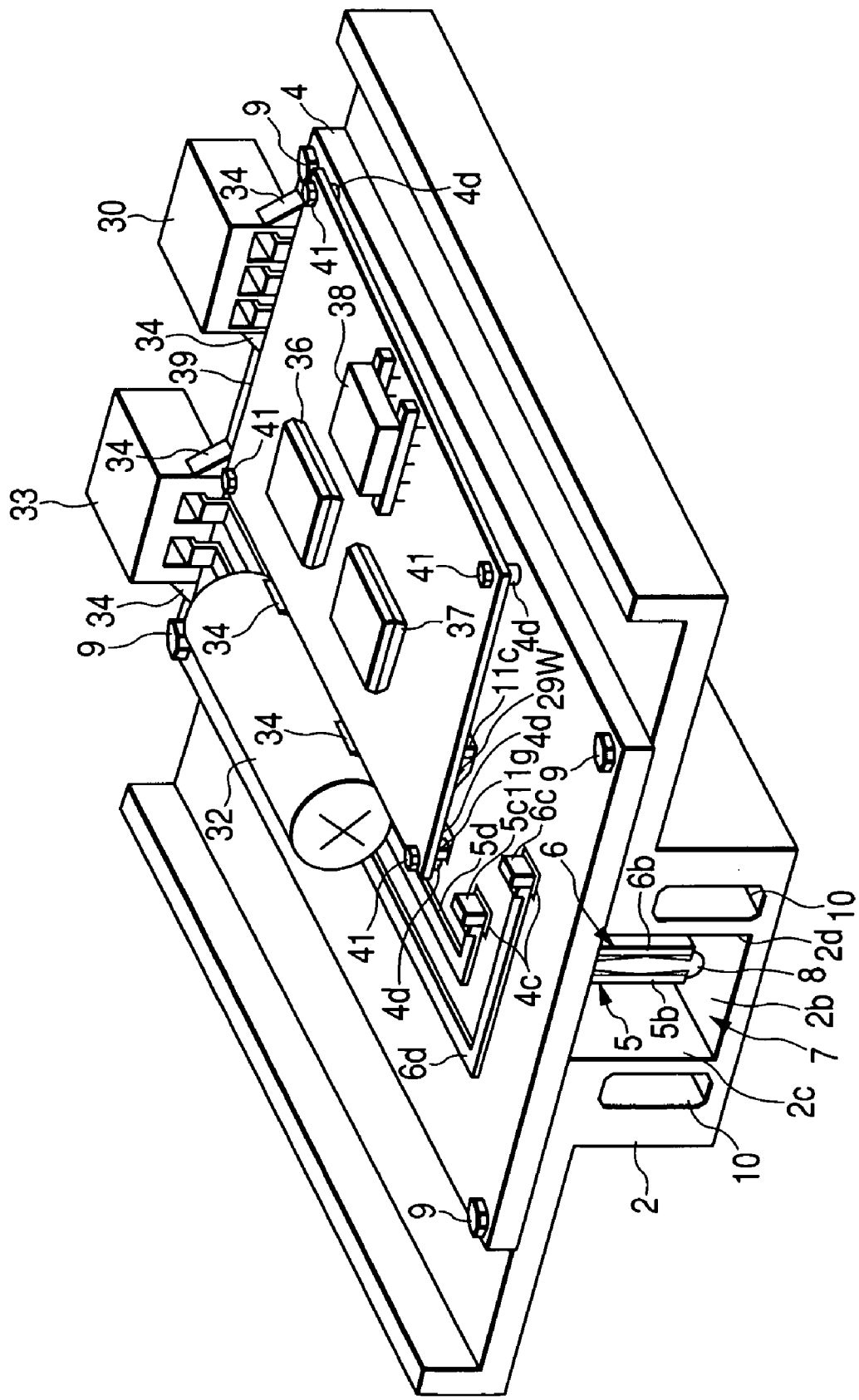
FIG. 5 is another perspective view indicating the power module structure shown in FIG. 1.
Figure 6:
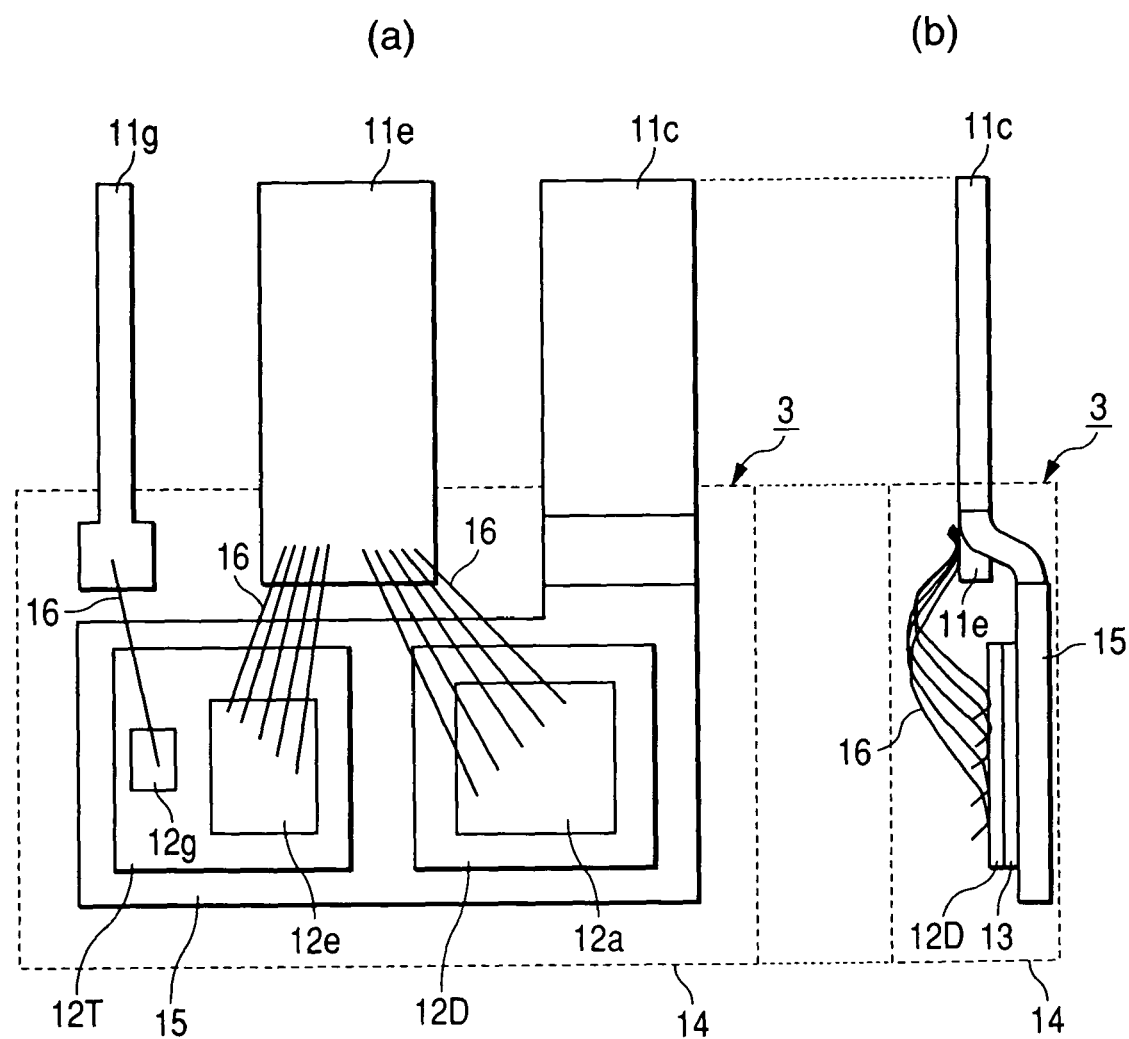
FIGS. 6A and 6B are a plan view indicating the internal structure of semiconductor equipment mounted in the power module shown in FIG. 1.

FIGS. 1 to 5 show the structure of the inverter INV in this embodiment. FIG. 6 shows the structure of the semiconductor equipment (electric equipment) mounted in the power module unit PMU of the inverter INV in this embodiment.

The power module unit PMU in this embodiment is formed by fixing semiconductor equipment 3 onto a heat dissipating member 2 by using a first fixing tool 1 and pressurizing tool.

As shown in FIG. 6, the semiconductor equipment 3 is single electric equipment separated from the module. When viewed externally, lead wires 11c, 11e, and 11g are extended from the inside of a resin package 14 to the outside.

A heat dissipating plate 15 and part of the lead wires 11c, 11e, and 11g are included in the resin package 14. The lead wires 11c and 11e and heat dissipating plate 15 are formed with plates that are made of a conductive metal such as copper or a copper alloy. The lead wire 11g is formed with a square timber made of a conductive metal such as copper or a copper alloy. The lead wire 11c is integrated with the heat dissipating plate 15. Accordingly, the lead wire 11c is mechanically and electrically connected to the heat dissipating plate 15.

The lead wire 11c and heat dissipating plate 15 may be formed separately. In this case, after being formed, the lead wire 11c and heat dissipating plate 15 are interconnected directly or through a connecting member.

Semiconductor chips 12T and 12D are mounted on the heat dissipating plate 15. The semiconductor chip 12T constitutes the IGBT described above; a collector electrode (not shown) provided on the heat dissipating plate 15 is joined to the heat dissipating plate 15 through a solder 13. Accordingly, the collector electrode of the semiconductor chip 12T is fixed onto the heat dissipating plate 15 and electrically connected to the heat dissipating plate 15 and lead wire 11c. An emitter electrode 12e and gate electrode 12g are provided opposite to the heat dissipating plate 15 of the semiconductor chip 12T. Wires 16 made of a conductive metal such as aluminum are joined between the emitter electrode 12e and lead wire 11e and between the gate electrode 12g and lead wire 11g.

Accordingly, the emitter electrode 12e is electrically connected to the lead wire 11e, and the gate electrode 12g is electrically connected to the lead wire 11g.

The semiconductor chip 12D constitutes the diode described above; a cathode electrode (not shown) provided on the heat dissipating plate 15 is joined to the heat dissipating plate 15 through the solder 13. Accordingly, the cathode electrode of the semiconductor chip 12D is fixed onto the heat dissipating plate 15 and electrically connected to the heat dissipating plate 15 and lead wire 11c. An anode electrode 12a is provided opposite to the heat dissipating plate 15 of the semiconductor chip 12D. Another wire 16 is joined between the anode electrode 12a and lead wire 11e. Accordingly, the anode electrode 12a is electrically connected to the lead wire 11e.

When the semiconductor chips 12T and 12D are mounted on the heat dissipating plate 15 and the wires 16 are joined between the electrodes of the semiconductor chips 12T and 12D and the corresponding lead wires, the plastic package 14 accommodates the semiconductor chips 12T and 12D, part of the lead wires 11c, 11e, and 11g, the heat dissipating plate 15, and the wires 16. The plastic package is formed by using a transfer mold method to apply electrically insulative resin such as epoxy resin.

In this embodiment, a full mode type of semiconductor equipment 3 that is fully covered by a resin member except part of the lead wires 11c, 11e, and 11g has been used as an example to describe the semiconductor equipment 3. However, a mold type of semiconductor equipment, which allows part of the heat dissipating plate 15 to appear from the plastic package 14, may be used. In this case, insulation treatment must be applied to the surface of the heat dissipating plate 15 to electrically insulate the heat dissipating plate 15 from other conductive members.

The heat dissipating member 2 is a heat sink made of a metal (aluminum or another metal having a superior thermal conductivity). As shown in FIGS. 1 to 5, the heat dissipating member comprises a rectangular parallelepiped main body and crank-shaped brim that are integrated with each other, the transverse width of the main body being smaller than the depth and larger than the height, the brim extending in both shorter-side directions of the main body from the tops of both sides in the shorter-side direction of the main body, the above metallic material being machined by molding or cutting. The brim comprises a transverse plate disposed at the tops of both sides in the shorter side of the main body and longitudinal plates, the upper surface of the transverse plate being flush with the upper surface of the main body, each of the longitudinal plates being disposed upward at right angles on the top surface of one end (end opposite to the main body) in the shorter-side direction of the transverse plate, the transverse plate and longitudinal plates are integrated with each other. The dimension of the transverse plate of the brim in the longer-side direction is equal to the dimension of the main body in the longer-side direction.

The longer-side direction is the depth direction of the main body of the heat dissipating member 2 when the transverse width of the rectangular parallelepiped main body of the heat dissipating member 2 is smaller than the depth and larger than the height. The shorter-side direction is the transverse width direction of the main body of the heat dissipating member 2 when the transverse width of the rectangular parallelepiped main body of the heat dissipating member 2 is smaller than the depth and larger than the height. These relations also hold in the description that follows. The term "height direction" in the following description means the height direction of the rectangular parallelepiped main body of the heat dissipating member 2 when the transverse width of the rectangular parallelepiped main body of the heat dissipating member 2 is smaller than the depth and larger than the height.

A recess 7 is formed at the center in the shorter-side direction of the main body of the heat dissipating member 2. The recess 7 is a concave groove that extends through the main body in the longer-side direction; there are provided two side walls to block both sides in the shorter-side direction and a bottom wall to block the bottom so that the upper portion is left open. A coolant passage 10 is formed in both-sides walls of the recess 7 so that the passage 10 is adjoined the recess 7. The coolant passage 10 is a passage in which a liquid coolant such as cooling water flows; the coolant passage is formed by a hole that has a rectangular cross section and extends through the main body in the longer-side direction. The side wall surfaces 2c and 2d of the recess 7 at both ends in the shorter-side direction (the surfaces, facing each other in the shorter direction, of the walls disposed at both ends in the shorter-side direction) and the bottom wall surface 2b extend parallel to the coolant passage 10 in the longer-side direction.

Three pieces of semiconductor equipment 3, which constitute the upper arm, are aligned in the longer-side direction on the side wall surface 2c of the recess 7 so that the bottom surfaces of the semiconductor equipment 3 are brought into surface contact with the side wall surface (each bottom surface of the semiconductor equipment is a heat dissipating surface, which is the one of the two main surfaces that is in the proximity to the heat dissipating plate 15). Another three pieces of semiconductor equipment 3, which constitute the lower arm, are aligned in the longer-side direction on the side wall surface 2d of the recess 7 in such a way that the bottom surfaces of the semiconductor equipment 3 are brought into surface contact with the side wall surface. Each pair of semiconductor equipment 3 constituting the same arm is disposed in the shorter-side direction so as to face each other. In this placement, the semiconductor 3 is disposed longitudinally on the bottom wall surface 2b so that one side (the side opposite to the side from which the lead wires 11c, 11e, and 11g extend) is brought into surface contact with the bottom wall surface 2b and the lead wires 11c, 11e, and 11g extend upward in the height direction.

In this embodiment, a case in which one side (the side opposite to the side from which the lead wires 11c, 11e, and 11g extend) of the semiconductor equipment 3 is brought into surface contact with the bottom wall surface 2b and the semiconductor equipment 3 is disposed longitudinally on the bottom wall surface 2b have been described. As another form of fixing the semiconductor equipment 3 onto the heat dissipating member 2, the semiconductor equipment 3 may be fixed to the heat dissipating member 2 so that the semiconductor equipment 3 is lifted from the bottom wall surface 2b.

A first fixing tool 1 is disposed on sides (upper surface sides (each of which is opposite to the one of the two main surfaces that is in the proximity to the heat dissipating plate 15)), opposite to the side wall surfaces 2c and 2d, of the semiconductor equipment 3. The first fixing tool 1 is a plate clip-like member having pressing parts and a connection part, which is a resin-molded body formed by molding resin with a metal mold so that the first fixing tool extends along the recess 7 in the longitudinal direction and has a U-shaped cross section in the longitudinal direction. The pressing parts are rectangular flat plates; the surfaces facing the side wall surfaces 2c and 2d are brought into surface contact with the surfaces, facing opposite to side wall surfaces 2c and 2d, of the semiconductor equipment 3, and face each other in the shorter-side direction. The connection part connects the two pressing parts. The connection part is a curved part that is curved in the height direction on the bottom wall surface 2b side, the top of the curved portion touches the bottom wall surface 2b. The resin member that forms the first fixing tool 1 is electrically insulative, which includes inorganic powdery fillers, typified by glass or silica, or glass fiber. This embodiment using this resin member to form the first fixing tool 1 increases the strength and heat resistance of the first fixing tool 1.

When the semiconductor equipment 3 is fixed to the heat dissipating member 2 so that the semiconductor equipment 3 is lifted from the bottom wall surface 2b as described above, a supporting part is preferably provided for the semiconductor equipment 3 on the semiconductor equipment 3 side of the pressing parts of the first fixing tool 1. The supporting part comprises a first supporting part that supports one side (the side opposite to the side from which the lead wires 11c, 11e, and 11g extend) of the semiconductor equipment 3 from the bottom wall surface 2b sides, a second supporting part that extends from the first supporting part to support two sides (remaining two sides other than the side from which the lead wires 11c, 11e, and 11g extend) in the array direction (longitudinal direction) of the semiconductor equipment 3 by clipping the bottom wall surface 2b sides from both sides in the array direction (longitudinal direction), and a third supporting part that supports two sides in the array direction (longitudinal direction) of the semiconductor equipment 3 by clipping sides near the lead wires 11c, 11e, and 11g (the sides near a second fixing tool 4 described below) from both sides in the array direction (longitudinal direction). The third supporting part may be provided on the second fixing tool 4 so that the third supporting part extends from the bottom of the second fixing tool 4 described below toward the bottom wall surface 2b.

The pressurizing tool is disposed opposite to the semiconductor equipment 3 side of the pressing parts of the first fixing tool 1 in such a way that the pressurizing tool is clamped by the pressing parts of the first fixing tool 1. The pressurizing tool is a laminate member that comprises an elastic member 8 that is electrically insulative, a DC positive-side wiring member 5, and a DC negative-side wiring member 6, all of which are overlaid on one another in the shorter-side direction; the DC positive-side wiring member and DC negative-side wiring member 6 are disposed on both sides of the elastic member 8 in the shorter-side direction so that they clamp the elastic member 8 from both sides in the shorter-side direction.

The elastic member 8 is an expanding and contracting member that comprises a pressing part and holding parts, which is formed by rubber made of, for example, silicone resin having a superior heat resistance. Even in environments at high temperatures and under other severe conditions, silicone resin is electrically insulative, undergoes extremely less permanent strain due to compression, and has a soft elasticity, so the silicon resin is optimum for the elastic member of the module. The pressing part is a polyhedron having a hexagonal cross section in the longer-side direction that extends in the longer-side direction along the DC positive-side wiring member 5 and the DC negative-side wiring member 6 (recess 7); the pressing part generates an elastic pressing force to press the semiconductor equipment 3 against the heat dissipating member 2. Each holding part is a half column having a half-circle cross section in the longer-side direction that extends in the longer-side direction along the DC positive-side wiring member 5 or the DC negative-side wiring member 6 (recess 7); the holding parts are disposed at both sides of the pressing part in the height direction to hold the DC positive-side wiring member 5 and the DC negative-side wiring member 6 by clamping them from both sides in the height direction while the DC positive-side wiring member 5 and the DC negative-side wiring member 6 touch the pressing part.

Both sides of the pressing part in the shorter-side direction are two oblique surfaces. The two oblique surfaces are angled from the holding part side (the bottom of the holding part) of the pressing part in the height direction toward the DC positive-side wiring member 5 and the DC negative-side wiring member 6; the oblique surfaces are combined into a gabled form by forming a vertex at the center of the pressing part in the height direction. The center (the vertex formed by the two oblique surfaces) of the pressing part in the height direction touches the surfaces, facing the elastic member 8, of the DC positive-side wiring member 5 and the DC negative-side wiring member 6. Part of the arc-shaped surface of the holding part disposed at one side (the side facing the connection part of the first fixing tool 1) of the pressing part in the height direction touches the inner surface of the connection part of the first fixing tool 1 within the inner side of the first fixing tool 1.

In this example, the elastic member 8 formed by combining a polyhedron and half column is used as an example. However, a sheet-like elastic member may be used as the elastic member 8, in which case the two main surfaces of the sheet-like elastic member in the shorter-side direction are clamped by the DC positive-side wiring member 5 and the DC negative-side wiring member 6 from both shorter-side directions.

The DC positive-side wiring member 5 and the DC negative-side wiring member 6 are disposed between the pressing part of the elastic member 8 and the pressing parts, facing the elastic member 8, of the first fixing tool 1 and clamped. The DC positive-side wiring member 5 and the DC negative-side wiring member 6 are conductive members that comprise pressing parts 5b and 6b, first connection parts 5a and 6a, and second connection parts 5c and 6c, respectively; they are made of a metal having a superior conductivity such as copper.

The pressing parts 5b and 6b are flat plates that are disposed so that they extend in parallel along the recess 7 in the longer-side direction and the two main surfaces face in the shorter-side direction. The pressing parts are brought into surface contact with the surfaces, facing the elastic member 8, of the pressing parts of the first fixing tool 1 and press the surfaces, facing the elastic member 8, of the pressing parts of the first fixing tool 1 when pressed by the pressing part of the elastic member 8.

The first connection part 5a is a plate-like conductive member on the lead wire side that is disposed on one side (the open side of the recess 7) of the pressing part 5b in the height direction, which is disposed with a spacing in the longer-side direction so that it is placed at a position corresponding to the lead wire 11c of the semiconductor equipment 3 in a phase on the upper arm side. The first connection part 6a is a plate-like conductive member on the lead wire side that is disposed on one side (the open side of the recess 7) of the pressing part 6b in the height direction, which is disposed with a spacing in the longer-side direction so that it is placed at a position corresponding to the lead wire 11e of the semiconductor equipment 3 in a phase on the lower arm side. The first connection parts 5a and 6a extend straight from the inner side of the recess 7 to the outer side of the recess 7, pass through a through hole 4b in the second fixing tool 4 described below, and bend toward the lead wire side of the corresponding semiconductor equipment 3. The ends of the leads of the first connection parts 5a and 6a are brought into surface contact with the corresponding lead wires and joined by, for example, welding. Since the first connection part 5a and the first connection part 6a are connected to different lead wires, they are shifted in the longer-side direction.

The second connection parts 5c and 6c are plate-like conductive members on the terminal side that are disposed on one side (the open side of the recess 7) of the pressing parts 5b and 6b in the height direction and on one side (in this embodiment, an end opposite to the side on which a DC terminal block 33 and AC terminal block 30 described below are mounted) of the pressing parts 5b and 6b in the longer-side direction. The second connection parts extend straight from the inner side of the recess 7 to the outer side of the recess 7 and pass through a through hole 4c in the second fixing tool 4 described below, as in the first connection parts 5a and 6a, and then bend in the same direction as the first connection parts 5a and 6a. Since the second connection part 5c and the second connection part 6c are connected to wiring members placed in parallel on the same surface, they shifted in the longer-side direction.

The holding parts of the elastic member 8 have cutouts on one side (the side from which the first connection parts 5a and 6a and the second connection parts 5c and 6c extend) at which the holding parts overlie the first connection parts 5a and 6a and the second connection parts 5c and 6c, according to the plate widths (the dimensions in the longer-side direction) and the plate thicknesses (the dimensions in the shorter-side direction) of the overlapped parts of the first connection parts 5a and 6a and the second connection parts 5c and 6c.

Owing to the displacements in the longer-side direction between the first connection parts 5a and 6a and between the second connection parts 5c and 6c also shift, a creepage distance is obtained between the first connection parts 5a and 6a and another creepage distance is obtained between the second connection parts 5c and 6c. This eliminates the need to provide insulators between the first connection parts 5a and 6a and between the second connection parts 5c and 6c. If the thickness of the elastic member 8 in the shorter-side direction becomes smaller than the current thickness, or the voltages applied across the first connection parts 5a and 6a and across the second connection parts 5c and 6c becomes higher than the current voltage, insulators need to be provided between the first connection parts 5a and 6a and between the second connection parts 5c and 6c. In this case, extensions that are extending part of the elastic member 8 in the height direction may be provided to the elastic member 8 so that parts of the elastic member 8 intervene between the first connection parts 5a and 6a and between the second connection parts 5c and 6c.

The dimensions of the recess 7, the first fixing tool 1, and the pressurizing tool (the elastic member 8, the DC positive-side wiring member 5, and the DC negative-side wiring member 6) are related as follows: recess 7>pressurizing tool>first fixing tool 1.

In the state in which the recess 7, the semiconductor equipment 3, the first fixing tool 1, and the pressurizing tool (the elastic member 8, the DC positive-side wiring member 5, and the DC negative-side wiring member 6) are accommodated in the recess 7, a second fixing tool 4 is provided on the upper surface of the heat dissipating member 2. The second fixing tool 4 prevents the semiconductor equipment 3, the first fixing tool 1, and the pressurizing tool (the elastic member 8, the DC positive-side wiring member 5, and the DC negative-side wiring member 6) from being dropped from the recess 7. The second fixing tool 4 is also a flat plate-like member that fixes the lead wires 11c, 11e, and 11g of the semiconductor equipment 3 as well as the first connection parts 5a and 6a and second connection parts 5c and 6c of the DC positive-side wiring member 5 and the DC negative-side wiring member 6; the second fixing tool covers the open part of the recess 7 in the height direction, the upper surface of the main body of the heat dissipating member 2, and part of the upper surface of the flat part of the brim, and is fixed to the flat part of the brim of the heat dissipating member 2 by bolts 9. Non-through round holes 2a with which to engage the bolts 9 are formed at four places on the flat part of the brim of the heat dissipating member 2.

The second fixing tool 4 has through holes 4a, 4b, and 4c and non-through holes 4d. The through-holes 4a are round holes through which the bolts 9 pass in the height direction; which are formed at the four corners of the second fixing tool 4 so that they face the non-through round holes 2a. The through holes 4b are rectangular holes through which the lead wires 11c, 11e, and 11g pass in the height direction together with the first connection part 5a of the DC positive-side wiring member 5 or the first connection part 6a of the DC negative-side wiring member 6 for each piece of semiconductor equipment 3; two arrays of holes, each comprising three holes in the longer-side direction, are formed in the shorter-side direction at the center of the second fixing tool 4 in correspondence to the positions of the semiconductor equipment 3, the holes being at positions corresponding to the lead wires 11c, 11e, and 11g as well as the first connection part 5a of the DC positive-side wiring member 5 or the first connection part 6a of the DC negative-side wiring member 6 for each piece of semiconductor equipment 3.

The through holes 4c are rectangular holes through which the second connection part 5c of the DC positive-side wiring member 5 and the second connection part 6c of the DC negative-side wiring member 6 pass in the height direction, which are formed at positions corresponding to the second connection parts 5c and 6c of the DC positive-side wiring member 5 and the DC negative-side wiring member 6 so that the holes are formed on the extension lines of the two arrays of the through holes 4b in the longer-side direction.

The second fixing tool 4 is also electrically insulative and is formed by molding, such as metal molding, using resin that includes inorganic powdery fillers, typified by glass or silica, or glass fiber, as is the first fixing tool 1. This embodiment using this resin to form the second fixing tool 4 increases the strength and heat resistance of the second fixing tool 4, as is the first fixing tool 1.

The second fixing tool 4 includes a DC (input) circuit that extends from the DC terminal block 33 to the bridge circuits (arms in all phases) and an AC (output) circuit that extends from the bridge circuits (arms in all phases) to the AC terminal block 30. In this embodiment, the DC (input) circuit and AC (output) circuit are formed so that DC power is input from an end (opposite to the end on which the through holes 4c are formed) of the second fixing tool 4 in the longer-side direction, the input DC power is converted by the bridge circuits to three-phase AC power, and the converted three-phase AC power is output from the one end of the second fixing tool 4 in the longer-side direction. Accordingly, in this embodiment, the DC (input) circuit and AC (output) circuit are disposed at diametrically opposite positions with respect to the arrays of the through holes 4b formed in the longer-side direction; the DC (input) circuit is disposed on one side (toward the array of the semiconductor equipment 3 on the upper arm side with respect to the center of the shorter-side direction) and the AC (output) circuit is disposed on the other side (toward the array of the semiconductor equipment 3 on the lower arm side with respect to the center of the shorter-side direction).

The DC terminal block 33 and AC terminal block 30 are provided at one end (opposite to the end at which the through holes 4c are formed) of the second fixing tool 4 in the longer-side direction and toward the outer sides of the shorter-side direction with respect to the arrays of the through holes 4b formed in the longer-side direction along the central line in the shorter-side direction; the terminal blocks project outwardly in the longer-side direction from the one end of the second fixing tool 4. The DC terminal block 33 and AC terminal block 30 are used to electrically connect the outside of the inverter INV and the power module unit PMU; each of the terminal blocks comprises terminals that are formed to be connectable to an external cable and a case that covers the terminals.

A third connection part 5d (6d) of the wiring member 5 (6) on the DC positive (negative) side is electrically and mechanically connected to the positive (negative) terminal of the DC terminal block 33. The third connection parts 5d and 6d are made of a metal having a superior conductivity such as copper, which are flat plate-like conductive members connected to the second connection parts 5c and 6c at ends opposite to the ends connected to the DC terminal block 33. The third connection parts 5d and 6d extend from the case of the DC terminal block 33, bend toward the second fixing tool 4, and laid on the surface of the second fixing tool 4 so that they extend on the surface of the second fixing tool 4 in the longer-side direction toward to the other end (opposite to the end at which the through holes 4c are formed). Then the third connection parts 5d and 6d bend toward the second connection parts 5c and 6c at right angles in the shorter-side direction on the other side of the second fixing tool 4 in the longer-side direction on the surface of the second fixing tool 4, and extend in the shorter-side direction toward the second connection parts 5c and 6c. The ends of the third connection parts 5d and 6d are brought into surface contact with the second connection parts 5c and 6c and joined by, for example, welding.

An AC U-phase (V-phase or W-phase) wiring member 29U (29V or 29W) is electrically and mechanically connected to the U-phase (V-phase or W-phase) terminal of the AC terminal block 30. The AC U-phase (V-phase or W-phase) wiring member 29U (29V or 29W) is made of a metal having a superior conductivity such as copper, which is a flat plate-like conductive member connected to the lead wire 11e of the semiconductor equipment 3 on the U-phase (V-phase or W-phase) upper arm side and to the lead wire 11c of the semiconductor equipment 3 on the U-phase (V-phase or W-phase) lower arm side at an end opposite to the end connected to the AC terminal block 30. The AC U-phase (V-phase or W-phase) wiring member 29U (29V or 29W) extends from the case of the AC terminal block 30, and bends toward the second fixing tool 4.

The AC U-phase wiring member 29U is laid on the surface of the second fixing tool 4 so that it passes by the through hole 4b through which the lead wires 11c, 11e and 11g of the semiconductor equipment 3 of the U-phase lower arm side pass, on one side (toward the AC terminal block 30) of that through hole 4b in the longer-side direction, extends on the surface of the second fixing tool 4 in the shorter-side direction, and proceeds between the two arrays of the through holes 4b in the longer-direction. Then, the AC U-phase wiring member 29U bends at right angles in the longer-side direction between the two arrays of the through holes 4b in the longer-direction on the surface of the second fixing tool 4, and extends in the longer-side direction between the two through holes 4b through which the lead wires 11c, 11e and 11g of the U-phase semiconductor equipment 3 pass. Then, the AC U-phase wiring member 29U branches in two ways approximately in the shorter-side direction (approximately in a T-shaped form) between the two through holes 4b through which the lead wires 11c, 11e, and 11g of the U-phase semiconductor equipment 3 pass on the surface of the second fixing tool 4, and extends in the shorter-side direction toward the lead wire 11e of the semiconductor equipment 3 on the U-phase upper arm side and the lead wire 11c of the semiconductor equipment 3 on the U-phase lower arm side. One end and the other end of the AC U-phase wiring member 29U are brought into surface contact with the lead wire 11e of the semiconductor equipment 3 on the U-phase upper arm side and the lead wire 11c of the semiconductor equipment 3 on the U-phase lower arm side, respectively, and joined by, for example, welding.

The AC V-phase (W-phase) wiring member 29V (29W) is laid on the surface of the second fixing tool 4 so that it extends on the surface of the second fixing tool 4 in the longer-side direction toward the other end (the end at which through holes 4c are formed) in the longer-side direction, bends at right angles in the shorter-side direction in the middle on the surface of the second fixing tool 4, and extends toward the through holes 4b in the shorter-side direction. Then the AC V-phase (W-phase) wiring member 29V (29W) passes between the through hole 4b through which the lead wires 11c, 11e and 11g of the semiconductor equipment 3 on the U-phase (V-phase) lower arm side pass and the through hole 4b through which the lead wires 11c, 11e and 11g of the semiconductor equipment 3 on the V-phase (W-phase) lower arm side pass, extends in the shorter-side direction, and proceeds between the two arrays of the through holes 4b in the longer-direction. Then the AC V-phase (W-phase) wiring member 29V (29W) bends at right angles in the longer-side direction between the two arrays of the through holes 4b in the longer-direction on the surface of the second fixing tool 4, and extends in the longer-side direction so that it proceeds between the two through holes 4b through which the lead wires 11c, 11e and 11g of the V-phase (W-phase) semiconductor equipment 3 pass. Then the AC V-phase (W-phase) wiring member 29V (29W) branches in two ways approximately in the shorter-side direction (approximately in a T-shaped form) between the two through holes 4b through which the lead wires 11c, 11e, and 11g of the V-phase (W-phase) semiconductor equipment 3 pass on the surface of the second fixing tool 4, and extends in the shorter-side direction toward the lead wire 11e of the semiconductor equipment 3 on the V-phase (W-phase) upper arm side and the lead wire 11c of the semiconductor equipment 3 on the V-phase (W-phase) lower arm side. One end and the other end of the AC V-phase (W-phase) wiring member 29V (29W) are brought into surface contact with the lead wire 11e of the semiconductor equipment 3 on the V-phase (W-phase) upper arm side and the lead wire 11c of the semiconductor equipment 3 on the V-phase (W-phase) lower arm side, respectively, and joined by, for example, welding.

An electrolytic capacitor 32 is disposed immediately above the third connection parts 5d and 6d. The electrolytic capacitor 32 is a cylindrical structure having a positive terminal and negative terminal; the electrolytic capacitor is placed on its side and fixed to the fixing parts 34 of the second fixing tool 4 so that it is disposed above the third connection parts 5d and 6d with a spacing left therebetween along the third connection parts 5d and 6d in the longer-side direction. The positive terminal and negative terminal of the electrolytic capacitor 32 are electrically connected to the third connection part 5d and the third connection part 6d, respectively.

In this embodiment, the third connection parts 5d and 6d, AC U-phase wiring member 29U, AC V-phase wiring member 29V, and AC W-phase wiring member 29W are laid on the second fixing tool 4. As another way of providing the wiring members, they may be embedded in the second fixing tool 4 when the second fixing tool 4 is molded.

A current sensor 31 is attached at a point on a part of the AC V-phase wiring member 29V and AC W-phase wiring member 29W that run in the longer-side direction. The current sensor 31 is a current transformer that comprises a C-shaped core and a magnetic sensor (including a Hall effect device, Hall IC, or the like) disposed at an open part of the core.

The second fixing tool 4 includes fixing parts 34. The fixing parts 34 support the DC terminal block 33, AC terminal block 30, and electrolytic capacitor 32; the fixing parts are molded integrally with the second fixing tool 4.

Of the fixing parts 34 provided at four places at one end (opposite to the end at which the through holes 4c are formed) of the second fixing tool 4 in the longer-side direction, the fixing parts 34 provided at two places at one end (toward the array of the semiconductor equipment 3 on the upper arm side with respect to the center of the shorter-side direction) in the shorter-side direction with respect to the arrays of the through holes 4b in the longer-side direction are engaged with the AC terminal block 33; the fixing parts 34 provided at the other end (toward the array of the semiconductor equipment 3 on the lower arm side with respect to the center of the shorter-side direction) in the shorter-side direction are engaged with the DC terminal block 30. The DC terminal block 33 and AC terminal block 30 are clamped by the fixing parts 34 from both sides in the shorter-side direction and fixed to the second fixing tool 4.

In this embodiment, the DC terminal block 33 and AC terminal block 30 are fixed to the second fixing tool 4 by engagement with the fixing parts 34. As another form of attaching the DC terminal block 33 and AC terminal block 30, they may be molded integrally with the second fixing tool 4.

The electrolytic capacitor 32 is engaged with fixing parts 34 that are disposed at four places along the third connection parts 5d and 6d on the second fixing tool 4, and straddles the third connection parts 5d and 6d in the shorter-side direction. The electrolytic capacitor 32 is clamped by the fixing parts 34 from both sides in the shorter-side direction and fixed to the second fixing tool 4.

Poles 4d are provided at four places on the second fixing tool 4. The poles 4d have threaded holes. The control circuit board 39 is placed on the poles 4d and fixed to the poles 4d by screws 41. Accordingly, the control circuit board 39 is disposed on the output (AC) circuit that extends from the bridge circuit to the AC terminal block 30. Mounted on the control circuit board 39 are the driving circuit 37, a microcomputer 36, and an insulated power supply 38.

The power module unit PMU, driving circuit unit DCU, and motor control unit MCU are assembled so that they are structured as described above; they are included in a metallic inverter case that has an electromagnetic shielding capability. The DC terminal block 33 and AC terminal block 30 are exposed outside the inverter case. The DC terminal block 33 is electrically connected to the power cable that is electrically connected to the high-voltage battery HBA. The AC terminal block 30 is electrically connected to the motor cable that is electrically connected to the M/G.

Next, the method of assembling the inverter INV and the effect of the structure for fixing the semiconductor equipment 3 will be described.

First, the three pieces of semiconductor equipment 3 on the upper arm side are arrayed on the side wall surface 2c of the recess 7 in the longer-side direction so that the bottom surfaces of the three pieces of semiconductor equipment 3 on the upper arm side are brought into surface contact with the bottom wall surface 2b of the heat dissipating member 2, and the side surfaces, in one direction, of the three pieces of semiconductor equipment 3 on the upper arm side are brought into surface contact with the side wall surface 2c of the recess 7. Similarly, the three pieces of semiconductor equipment 3 on the lower arm side are arrayed on the side wall surface 2d of the recess 7 in the longer-side direction so that the bottom surfaces of the three pieces of semiconductor equipment 3 on the lower arm side are brought into surface contact with the bottom wall surface 2b of the heat dissipating member 2, and the side surfaces, in one direction, of the three pieces of semiconductor equipment 3 on the lower arm side are brought into surface contact with the side wall surface 2d of the recess 7. The semiconductor equipment 3 on the upper arm side and the semiconductor equipment 3 on the lower arm side are each arrayed in the longer-side direction, and the semiconductor equipment 3 on the upper arm side and the semiconductor equipment 3 on the lower arm side that have the same phase face each other in the shorter-side direction.

Next, the first fixing tool 1 is inserted between each pair of the semiconductor equipment 3 that face each other in the shorter-side direction (sides, opposite to the side wall surfaces 2c and 2d, of the semiconductor equipment 3) so that the surfaces, facing the semiconductor equipment 3, of the pressing parts of the first fixing tool 1 are brought into surface contact with the surfaces, facing the first fixing tool 1, of the semiconductor equipment 3, and part of the arc-shaped surface of the curved part of the connection part of the first fixing tool 1 touches the bottom wall surface 2b.

In this embodiment, the semiconductor equipment 3 is arrayed in the recess 7 and then the first fixing tool 1 is inserted into the recess 7, as an example. As another order of attachment, the first fixing tool 1 may be first inserted into the recess 7 before the semiconductor equipment 3 is arrayed in the recess 7. In this case, the first fixing tool 1 is used as a supporting member. This prevents the semiconductor equipment 3 arrayed in the recess 7 from tipping and allows the semiconductor equipment 3 being positioned easily in the longer-side direction, increasing the easiness of assembling.

The pressing part of the elastic member 8 is clamped by the DC positive-side wiring member 5 and the DC negative-side wiring member 6 from both shorter-side directions. The pressing part of the elastic member 8 is then pressurized by the DC positive-side wiring member 5 and the DC negative-side wiring member 6 from both shorter-side directions (the pressing part of the elastic member 8 contracts in the shorter-side direction). While this state is maintained, the pressurizing tool, which comprises the elastic member 8, the DC positive-side wiring member 5, and the DC negative-side wiring member 6, is inserted between the pressing parts of the first fixing tool 1 so that the surfaces, facing the first fixing tool 1, of the pressing part 5b of the DC positive-side wiring member 5 and the pressing part 6b of the DC negative-side wiring member 6 are brought into surface contact with the surface, facing the DC positive-side wiring member and the DC negative-side wiring member 6, of the first fixing tool 1, and that part of the arc-shaped surface of the holding part disposed at one side (the side facing the connection part of the first fixing tool 1) of the elastic member 8 in the height direction touches the inner surface of the connection part of the first fixing tool 1 within the inner side of the first fixing tool 1.

When the pressurizing tool is inserted between the pressing parts of the first fixing tool 1 as described above, the pressing parts of the elastic member 8 are disposed between the pressing parts of the first fixing tool 1 while being pressurized from both shorter-side directions. At the same time, the pressing parts repel the pressurized force and transmit the elastic force, as a pressurized force resulting from the repulsion, to the surfaces, facing the elastic member 8, of the pressing parts 5b and 6b of the DC positive-side wiring member 5 and the DC negative-side wiring member 6. Accordingly, the surfaces, facing the elastic member 8, of the pressing parts 5b and 6b of the DC positive-side wiring member 5 and the DC negative-side wiring member 6 is pressed by the elastic force.

When the surfaces, facing the elastic member 8, of the pressing parts 5b and 6b of the DC positive-side wiring member 5 and the DC negative-side wiring member 6 are pressed as described above, the surfaces, facing the DC positive-side wiring member 5 and the DC negative-side wiring member 6, of the pressing parts of the first fixing tool 1 are pressed by the surfaces, facing the first fixing tool 1, of the pressing parts 5b and 6b of the DC positive-side wiring member 5 and the DC negative-side wiring member 6. At this time, the surfaces, facing the first tool 1, of the pressing parts 5b and 6b of the DC positive-side wiring member 5 and the DC negative-side wiring member 6 are in surface contact with the surfaces, facing the DC positive-side wiring member 5 and the DC negative-side wiring member 6, of the pressing parts of the first fixing tool 1.

When the surfaces, facing the DC positive-side wiring member 5 and the DC negative-side wiring member 6, of the pressing parts of the first fixing tool 1 are pressed as described above, the surface, facing the first fixing tool 1, of each piece of semiconductor equipment 3 is pressed by the surface, facing the semiconductor equipment 3, of the pressing part of the first fixing tool 1. At this time, the surfaces, facing the semiconductor equipment 3, of the pressing parts of the first fixing tool 1 are into surface contact with the surfaces, facing the first fixing tool 1, of the semiconductor equipment 3.

When the surface, facing the first fixing tool 1, of the semiconductor equipment 3 is pressed as described above, the surfaces (bottoms forming a heat dissipating surface), facing the side wall surfaces 2c and 2d, of the semiconductor equipment 3 are pressed against the surfaces of the side wall surfaces 2c and 2d. Accordingly, the surfaces, facing the side wall surfaces 2c and 2d, of the semiconductor equipment 3 are brought into surface contact with the side wall surfaces 2c and 2d. In this state, the semiconductor equipment 3 is fixed to the side wall surfaces 2c and 2d of the recess 7 in the heat dissipating member 2.

Next, the DC terminal block 33, the AC terminal block 30, the current sensor 31, the third connection parts 5d and 6d of the DC positive-side wiring member 5 and the DC negative-side wiring member 6, the AC U-phase wiring member 29U, the AC V-phase wiring member 29V, AC W-phase wiring member 29W, and the electrolytic capacitor 32 are provided on the second fixing tool 4. The second fixing tool 4 is fixed onto the heat dissipating member 2 by the bolts 9 so that the lead wires of 11c, 11e, and 11g of the semiconductor equipment 3 and the first connection parts 5a and 6a of the DC positive-side wiring member 5 and the DC negative-side wiring member 6 pass through the through holes 4b and that the second connection parts 5c and 6c of the DC positive-side wiring member 5 and the DC negative-side wiring member 6 pass through the through holes 4c.

Next, joining is performed by welding, soldering, or the like between the second connection part 5c and third connection part 5d of the DC positive-side wiring member 5, between the second connection part 6c and third connection part 6d of the DC negative-side wiring member 6, between the lead wire 11c of the semiconductor equipment 3 on the upper arm side in each phase and the first connection part 5a of the DC positive-side wiring member 5, between the lead wire 11e of the semiconductor equipment 3 on the lower arm side in each phase and the first connection part 6a of the DC negative-side wiring member 6, and among the lead wire 11e of the semiconductor equipment 3 on the U-phase (V-phase or W-phase) upper arm side, the lead wire 11c of the semiconductor equipment 3 on the U-phase (V-phase or W-phase) lower arm side, and AC U-phase (V-phase or W-phase) wiring member 29U (29V or 29W).

Next, the driving circuit 37, microcomputer 36, and insulated power supply 38 are mounted on the control circuit board 39, and the control circuit board 39 are fixed to the poles 4d of the second fixing tool 4 with the screws 41. The current sensor 31 and the lead wires 11g of the semiconductor equipment 3 are electrically connected to the control circuit board 39.

Connection conductors may be used to electrically connect the current sensor 31 and the lead wires 11g of the semiconductor equipment 3 to the control circuit board 39. Alternatively, the lead wires of the current sensor 31 and the lead wires 11g of the semiconductor equipment 3 may pass through the control circuit board 39 to join the lead wires of the current sensor 31 and the lead wires 11g of the semiconductor equipment 3 to the control circuit board 39 by soldering so that the current sensor 31 and the lead wires 11g of the semiconductor equipment 3 are electrically connected to the control circuit board 39. To increase the easiness of assembling the inverter INV, the latter connection method is preferable.

The structure integrally incorporating the power module unit PMU, driving circuit unit DCU, and motor control unit MCU as described above is accommodated in the inverter case. This completes the inverter INV. The DC terminal block 33 exposed outside the inverter case is electrically connected to a power cable that is electrically connected to the high-voltage battery HBA. The AC terminal block 30 exposed outside the inverter case is electrically connected to a motor cable that is electrically connected to the motor generator M/G.

According to this embodiment described above, the semiconductor equipment 3 is pressed against and fixed to the side wall surfaces 2c and 2d of the recess 7 by the pressurizing tool and the first fixing tool 1 so that the heat dissipating surface formed at the bottom of the semiconductor equipment 3 is brought into surface contact with the side wall surfaces 2c and 2d of the heat dissipating member 2. This reduces the thermal resistance between the heat dissipating surface formed at the bottom of the semiconductor equipment 3 and the side wall surfaces 2c and 2d of the heat dissipating member 2. Furthermore, the contact between the heat dissipating surface formed at the bottom of the semiconductor equipment 3 and the side wall surfaces 2c and 2d of the heat dissipating member 2 becomes stable, stabilizing the thermal resistance therebetween. According to this embodiment, therefore, heat dissipation of the semiconductor equipment 3 can be improved, and thereby the power module unit PMU can be made compact owing to increased cooling performance of the power module unit PMU, making the inverter INV compact.

According to this embodiment, since the DC positive-side wiring member 5, the DC negative-side wiring member 6, and the elastic member 8 for electrically insulating them from each other are used to constitute the pressurizing tool, parts in the electric circuit are allowed to double as the pressurizing tool. According to this embodiment, therefore, the shared use of parts of the module is enabled and the semiconductor equipment 3 can be fixed to the heat dissipating member 2 without using a new part in the module. Accordingly, this embodiment can reduce the cost of the power module unit PMU as a result of reducing the number of parts in the power module. PMU, and thereby makes the inverter INV inexpensive.

According to this embodiment, the pressurizing tool is formed by a laminate member in which the elastic member 8, the DC positive-side wiring member 5, and the DC negative-side wiring member 6 are laid in the shorter-side direction in such a way that the elastic member 8 is clamped by the DC positive-side wiring member 5 and the DC negative-side wiring member 6 from both shorter-side directions, so the pressurizing tool is expandable and contractible in the shorter-side direction. According to this embodiment, if the heat dissipating member 2, the semiconductor equipment 3, or the first fixing tool 1 causes thermal expansion and contraction in the shorter-side direction, the laminate member follows the thermal expansion and contraction, and expands and contracts while maintaining the force to press the first fixing tool 1. The electric equipment 3 can be thus left fixed and the stress caused by the thermal expansion and contraction in the shorter-side direction can be alleviated even if an adverse effect by the thermal expansion and contraction arises. According to this embodiment, therefore, the high reliability of the power module unit PMU achieved by the expandable and contractible pressurizing tool makes the inverter INV highly reliable.

According to the present embodiment, the pressurizing tool is formed so that the elastic force of the elastic member 8 is transmitted to the metallic DC positive-side wiring member 5 and DC negative-side wiring member 6 that cause less thermal deformation than the resin member of the elastic member 8, and the DC positive-side wiring member 5 and DC negative-side wiring member 6 pressurize the first fixing tool 1; so even when the power module unit PMU is placed in a high-temperature environment, the pressurizing force of the pressurizing tool can be suppressed from being lowered. This suppresses the reduction in the force to press the semiconductor equipment 3 even in the high-temperature environment. Therefore, this embodiment can make the thermal resistance of the semiconductor equipment 3 more stable.

According to this embodiment, since silicon resin that undergoes less permanent strain due to compression is used to form the elastic member 8, even when the power module unit PMU is placed in a high-temperature environment for a long period of time, the elastic force depression due to thermal fatigue and creep fatigue can be minimized, thereby suppressing the reduction in the force to press the semiconductor equipment 3 for a long period of time. Therefore, this embodiment keeps the thermal resistance of the semiconductor equipment 3 stable for a long period of time.

According to this embodiment, since the pressurizing tool is formed by clamping the elastic member 8 by the DC positive-side wiring member 5 and the DC negative-side wiring member 6 in which currents flow in opposite directions and placed near the semiconductor equipment 3, the floating inductance of the DC positive-side wiring member 5 and the DC negative-side wiring member 6 can be reduced. According to this embodiment, therefore, surge overvoltage developed on the DC positive-side wiring member 5 and the DC negative-side wiring member 6 can be reduced. Therefore, this embodiment reduces the loss caused during the switching operation of the semiconductor equipment 3, thereby improving resistance of the semiconductor equipment 3 to destruction due to the overvoltage.

According to this embodiment, the DC positive-side wiring member 5 and the DC negative-side wiring member 6 are disposed in the recess 7 as part of the pressurizing tool, so a spacing above the heat dissipating member 2 can be used efficiently. This enables the control circuit board 39, on which the DC terminal block 33, AC terminal block 30, current sensor, electrolytic capacitor 32, driving circuit 37, microcomputer 36, and insulated power supply 38 are mounted, to be mounted efficiently near the power module unit PMU. This embodiment can thus make the inverter INV further compact.

According to this embodiment, a second fixing tool 4 is provided above the heat dissipating member 2 so as to cover the opening of the recess 7 in the height direction, preventing the semiconductor equipment 3, first fixing tool 1, and pressurizing tool from dropping from the recess 7.

According to this embodiment, the lead wires of 11c, 11e, and 11g of the semiconductor equipment 3, the first connection part 5a and second connection part 5c of the DC positive-side wiring member 5, and the first connection part 6a and second connection part 6c of the DC negative-side wiring member 6 pass through the through holes 4b and 4c in the second fixing tool 4, so they can be fixed by the second fixing tool 4. Accordingly, this embodiment can suppress stress caused by vibration and other external stress on the joint part between the lead wire 11c of the semiconductor equipment 3 and the first connection part 5a of the DC positive-side wiring member 5, the joint part between the lead wire 11e of the semiconductor equipment 3 and the first connection part 6a of the DC negative-side wiring member 6, the joint part between the second connection part 5c and third connection part 5d of the DC positive-side wiring member 5, the joint part between the second connection part 6c and third connection part 6d of the DC negative-side wiring member 6, and joint parts between the lead wires 11c and 11e of the semiconductor equipment 3 and the wiring members 29U, 29V, and 29W of the AC U, V, and W phases. Accordingly, this embodiment can improve the electrical lives of the above joint parts.

According to this embodiment, the DC terminal block 33, the AC terminal block 30, the current sensor, the electrolytic capacitor 32, the third connection parts 5d and 6c of the DC positive-side wiring member 5 and the DC negative-side wiring member 6, wiring members 29U, 29V, and 29W of the AC U, V, and W phases are fixed to the second fixing tool 4 or integrated into it by an integral molding method, so fixing parts for fixing these parts and a mounting spacing can be eliminated. This embodiment can thus make the inverter INV further compact and inexpensive. Furthermore, this embodiment can suppress the above parts from being damaged or failing due to vibration.

According to this embodiment, the control circuit board 39 on which the driving circuit 37, microcomputer 36, and insulated power supply 38 are mounted is fixed onto the poles 4d on the second fixing tool 4, so fixing parts for fixing them and a mounting spacing can be eliminated. This embodiment can thus make the inverter INV further compact and inexpensive. Furthermore, this embodiment can suppress the above parts from being damaged or failing due to vibration.

In this embodiment described above, a symmetrical laminate structural layout is used as an example in which the semiconductor equipment 3 on the upper arm side and the semiconductor equipment 3 on the lower arm side that have the same phase are arrayed so that they face each other in the shorter-side direction, and the first tool 1 and pressurizing tool are disposed between them. As another structural layout, however, an asymmetrical laminate structural layout may be used in which semiconductor equipment 3 is arrayed on one side in the shorter-side direction and the first tool 1 and pressurizing tool are disposed between the semiconductor equipment 3 and a side wall of the heat dissipating member 2. In this case, the pressurizing tool comprises either of the DC positive-side wiring member 5 and the DC negative-side wiring member 6, the side wall of the heat dissipating member 2, and the elastic member 8 clamped by them from both sides in the shorter-side direction. The first fixing tool 1 comprises a pressing part only on one side.

Embodiment 2

A second embodiment of the present invention will be described with reference to FIG. 9.

Figure 9:
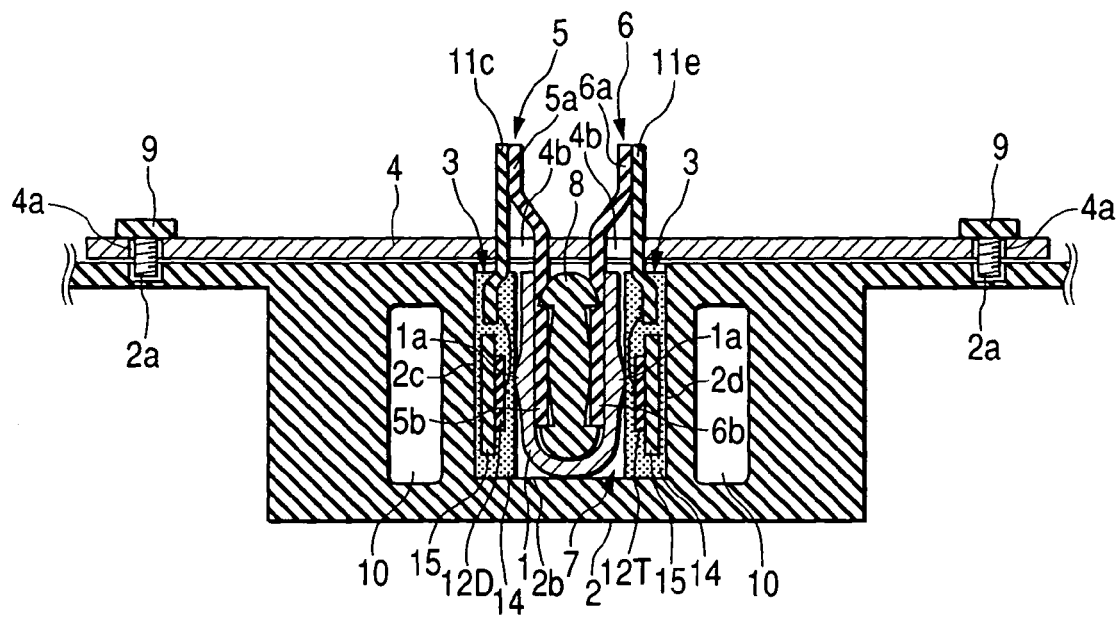
FIG. 9 is a cross-sectional view indicating the structure of a power module in an inverter that is a second embodiment of the present invention.

FIG. 9 shows the structure of an inverter INV in this embodiment.

This embodiment is an improvement of the first embodiment; protrusions 1a are formed on the surface, facing the semiconductor equipment 3, of each pressing part of the first fixing part 1. The protrusions 1a are formed integrally at a plurality of positions on the pressing parts of the first fixing tool 1 in the longer-side direction in correspondence with the array of semiconductor equipment 3 in such a way that the protrusions 1a touch the center on the surface, facing the first fixing tool 1, of the semiconductor equipment 3.

Other structures are the same as in the first embodiment; they are assigned the same reference numerals and their description is omitted.

According to this embodiment, protrusions 1a are formed on the surface, facing the semiconductor equipment 3, of each pressing part of the first fixing part 1, so the shape of the first fixing tool 1 which presses the semiconductor equipment 3 against the heat dissipating member 2 can be changed from a surface to points. Accordingly, this embodiment can eliminate the unevenness of the pressurizing force and can apply an approximately even pressurizing force to the bottom of the semiconductor equipment 3, making the heat resistance of the semiconductor equipment 3 further stable.

Embodiment 3

A third embodiment of the present invention will be described with reference to FIG. 10.

Figure 10:
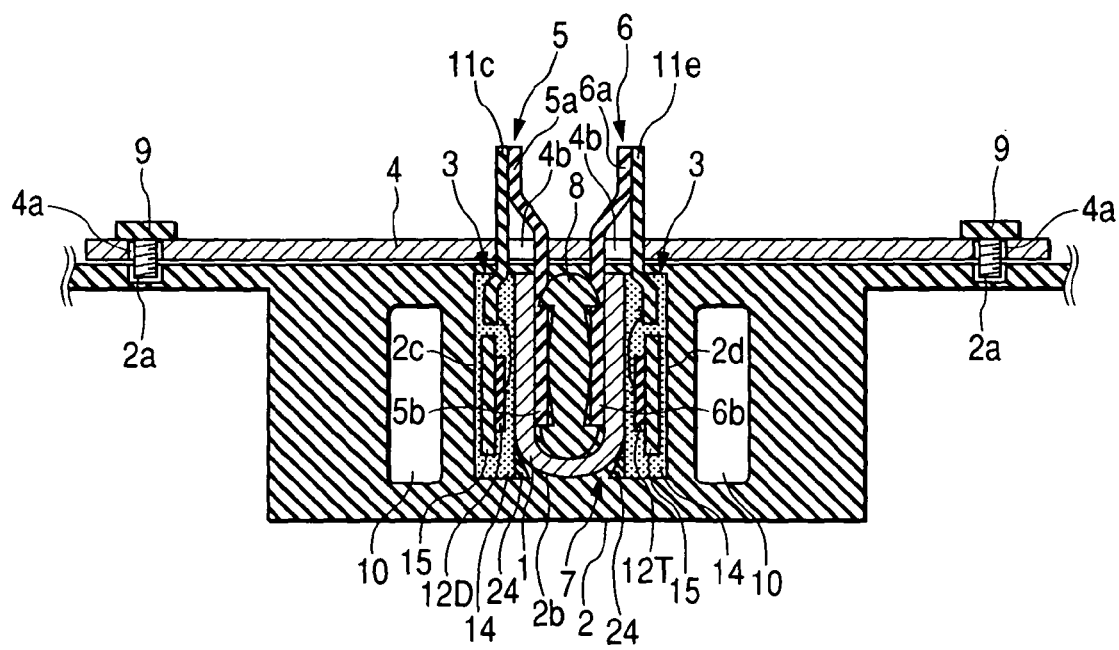
FIG. 10 is a cross-sectional view indicating the structure of a power module in an inverter that is a third embodiment of the present invention.

FIG. 10 shows the structure of an inverter INV in this embodiment.

This embodiment is an improvement of the first embodiment; protrusions 24 are formed on the bottom wall surface 2b of the heat dissipating member 2. The protrusions 24 are fixing parts for fitting the semiconductor equipment 3 between the side wall surfaces 2c and 2d so that the semiconductor equipment 3 does not drop off or tip over when the semiconductor equipment 3 is inserted in the recess 7 of the heat dissipating member 2 and arrayed. The protrusions 24 are formed integrally at a plurality of positions on the bottom wall surface 2b of the heat dissipating member 2 in correspondence with the array of semiconductor equipment 3.

Other structures are the same as in the first embodiment; they are assigned the same reference numerals and their description is omitted.

According to this embodiment, protrusions 24 are formed on the bottom wall surface 2b of the heat dissipating member 2, so it is possible to prevent the semiconductor equipment 3 from dropping off or tipping over when the semiconductor equipment 3 is inserted in the recess 7 of the heat dissipating member 2 and arrayed. Accordingly, this embodiment enables the power module PMU to be assembled easily, further enhancing the workability of assembling the power module unit PMU.

Furthermore, this embodiment increases the workability of positioning the semiconductor equipment 3 during the assembling of the power module unit PMU as well as the positioning precision.

Embodiment 4

A fourth embodiment of the present invention will be described with reference to FIG. 11.

Figure 11:
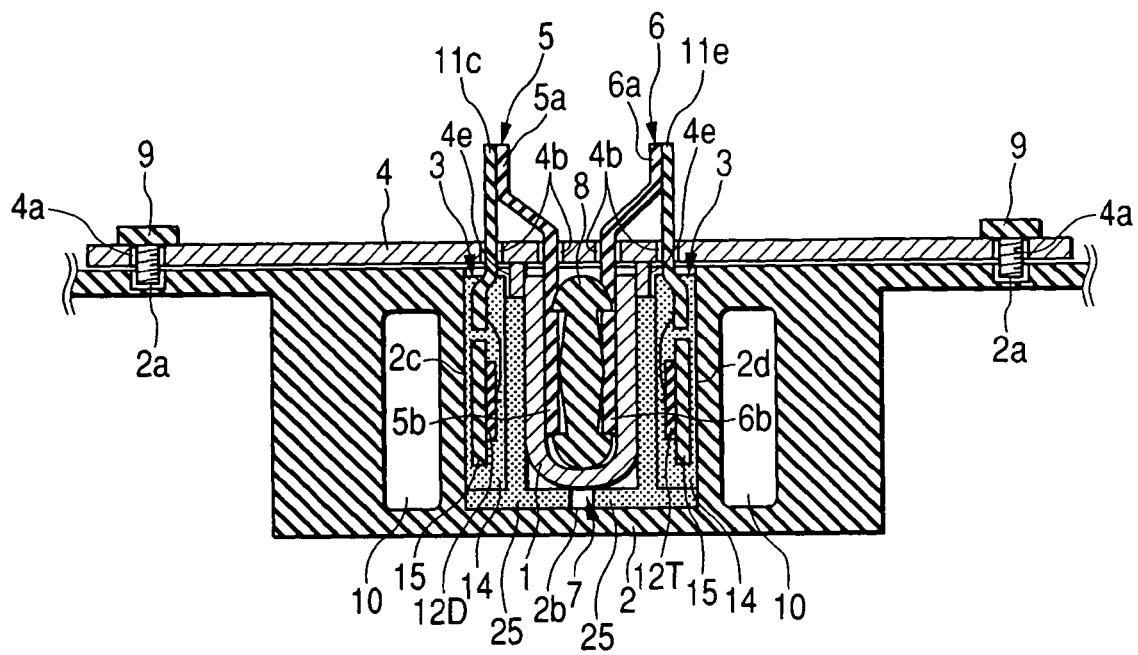
FIG. 11 is a cross-sectional view indicating the structure of a power module in an inverter that is a fourth embodiment of the present invention.

FIG. 11 shows the structure of an inverter INV in the fourth embodiment.

This embodiment is an improvement of the first embodiment; a third fixing tool 25 is provided between the semiconductor equipment 3 side of the pressing part of the first fixing tool 1 and the first fixing tool 1 side of the semiconductor equipment 3, and protrusions 4e are formed on the bottom of the second fixing tool 4. The third fixing tool 25 is a thermally conductive member that is a metal-molded body (the metal is aluminum, copper, or another metal having a superior thermal conductivity) or a resin-molded body formed by molding a mixture of electrically insulative resin and powder or particles of a highly thermally conductor such as ceramic or silica; the third fixing tool is formed by integrally combining two flat plates (bottom part and standing part) so that it extends along the recess 7 in the longer-side direction and has a reverse T-shaped cross section in the longer-side direction.

The standing part of the third fixing tool 25 extends vertically from the center in the shorter-side direction on the upper surface of the bottom toward the second fixing tool 4 in the height direction. The surface, facing the semiconductor equipment 3, of the standing part is brought into surface contact with the surface, facing the first fixing tool 1, of the semiconductor equipment 3, and the surface, facing the first fixing tool 1, of the standing part is brought into surface contact with the surface, facing the semiconductor equipment 3, of the pressing part of the first fixing tool 1 so that the heat generated by the semiconductor equipment 3 is transferred and the pressing force of the first fixing tool 1 presses the semiconductor equipment 3. The surface, facing the bottom wall surface 2b, of the bottom of the third fixing tool 25 is brought into surface contact with the surface of the bottom wall surface 2b so that the heat generated by the semiconductor equipment 3 and transferred to the standing parts of the third fixing tool 25 is transferred to the bottom wall surface 2b. The surface, opposite to the surface facing the bottom wall surface 2b, of the bottom of the third fixing tool 25 touches part of the connection part of the first fixing tool 1, and is brought into surface contact with one side (opposite to the side from which the lead wires 11c, 11e, and 11g extend) of the semiconductor equipment 3.

The protrusion 4e is a pressing member that presses the extending end of the standing part of the third fixing tool 25 by the tightening force of the bolts 9 that fix the second fixing tool 4 to the heat dissipating member 2; the protrusion is formed integrally on the second fixing tool 4 in such a way that the protrusion extends along the recess 7 in the longer-side direction and extends perpendicularly from the lower surface of the second fixing tool 4 toward the third fixing tool 25 in the height direction. When the extending end of the third fixing tool 25 is pressed by the extrusion 4e, the surface, facing the bottom wall surface 2b, of the bottom is brought into surface contact with the surface of the bottom wall surface 2b, and the heat of the semiconductor equipment 3 is transferred to the heat dissipating member 2.

Grease having a superior thermal conductivity (heat dissipating grease 19, for example) may be applied to the contact surface between the semiconductor equipment 3 and third fixing tool 25 and the contract surface between the heat dissipating member 2 and third fixing tool 25.

Other structures are the same as in the first embodiment; they are assigned the same reference numerals and their description is omitted.

According to this embodiment, the third fixing tool can be used to transfer the heat of the semiconductor equipment 3 from the surface, opposite to the surface facing the side wall surface 2c or 2d, of the semiconductor equipment 3, to the heat dissipating member 2, further enhancing heat dissipation from the semiconductor equipment 3. Accordingly, this embodiment can make the power module unit PMU further compact, thereby making the inverter INV compact.

Embodiment 5

A fifth embodiment of the present invention will be described with reference to FIG. 12.

Figure 12:
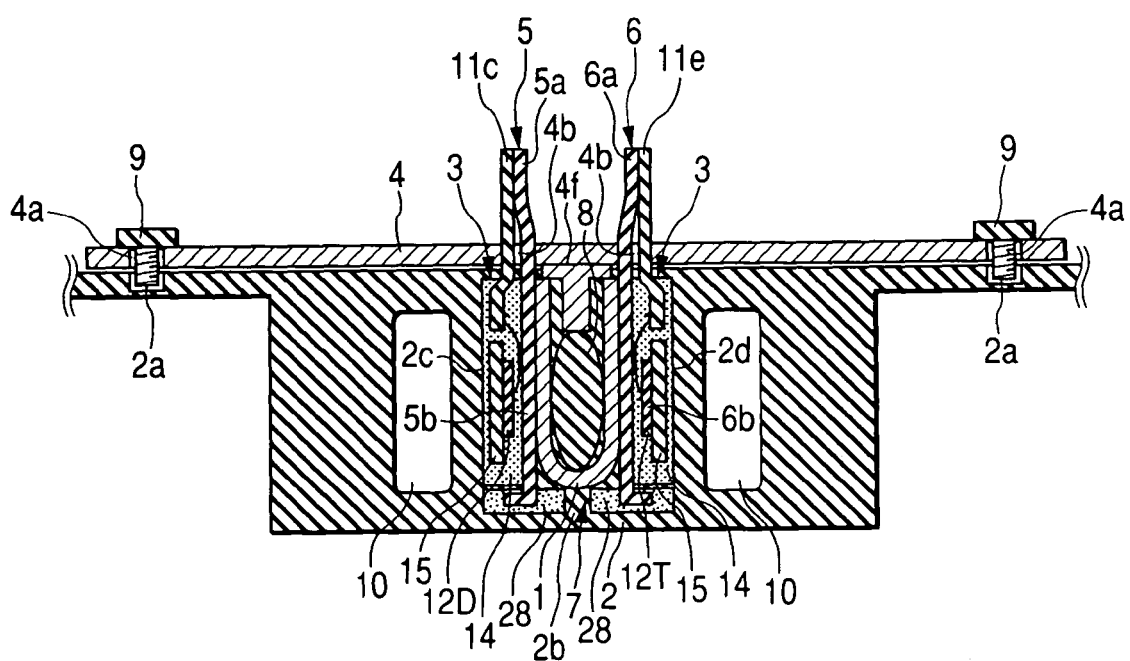
FIG. 12 is a cross-sectional view indicating the structure of a power module in an inverter that is a fifth embodiment of the present invention.

FIG. 12 shows the structure of an inverter INV in this embodiment.

This embodiment is an improvement of the first embodiment; the positions of the DC positive-side wiring member 5 and the DC negative-side wiring member 6, relative to the first fixing tool 1, in the shorter-side direction differ. In this embodiment, therefore, the elastic force of the elastic member 8 is transmitted to the surfaces, facing the elastic member 8, of the first fixing tool 1. The surfaces, facing the DC positive-side wiring member 5 and the DC negative-side wiring member 6, of the pressing parts of the first fixing tool 1 are then brought into surface contact with the surfaces, facing the first fixing tool 1, of the DC positive-side wiring member 5 and the DC negative-side wiring member 6, and press the surfaces, facing the first fixing tool 1, of the DC positive-side wiring member 5 and the DC negative-side wiring member 6. The surfaces, facing the semiconductor equipment 3, of the DC positive-side wiring member 5 and the DC negative-side wiring member 6 are then brought into surface contact with the surfaces, facing the DC positive-side wiring member 5 and the DC negative-side wiring member 6, of the semiconductor equipment 3, and press the surfaces, facing the DC positive-side wiring member 5 and the DC negative-side wiring member 6, of the semiconductor equipment 3, thereby fixing the semiconductor equipment 3.

The DC positive-side wiring member 5 and the DC negative-side wiring member 6 double as thermally conductive members that transfer the heat of the semiconductor equipment 3 to the bottom wall surface 2b of the heat dissipating member 2. Therefore, the ends, facing the bottom wall surface 2b, of the DC positive-side wiring member 5 and the DC negative-side wiring member 6 are packed by resin members 28 that are thermally conductive and electrically insulative. The resin member 28 is brought into surface contract with the bottom wall surface 2b of the heat dissipating member 2.

In this embodiment, although a spacing is left between one side surface (opposite to the side from which the lead wires 11c, 11e, and 11g extend) of the semiconductor equipment 3 and the resin member 28, the one side surface (opposite to the side from which the lead wires 11c, 11e, and 11g extend) of the semiconductor equipment 3 may be brought into contact with the resin member 28. Part of the connection part of the first fixing tool 1 touches the resin member 28.

The elastic member 8 is an elliptic cylinder, the diameter of which in the height direction is larger than the diameter in the shorter-side direction, so that the elastic force can be transmitted to the pressing parts of the first fixing tool 1. A protrusion 4f is formed on the lower surface of the second fixing tool 4. The protrusion 4f is T-shaped, which presses one side (facing the second fixing tool 4) of the elastic member 8 and first fixing member 1 in the height direction. Since the elastic member 8 is pressed by the protrusion 4f from the one side (facing the second fixing tool 4) in the height direction, its contraction and expansion are restricted in the height direction and not restricted in the shorter-side direction.

Other structures are the same as in the first embodiment; they are assigned the same reference numerals and their description is omitted.

According to this embodiment, the DC positive-side wiring member 5, the DC negative-side wiring member 6, and the resin 28 can be used to transfer the heat of the semiconductor equipment 3 to the heat dissipating member 2 from the sides, opposite to the side wall surfaces 2c and 2d, of the semiconductor equipment 3, further enhancing heat dissipation from the semiconductor equipment 3. Accordingly, this embodiment can make the power module unit PMU further compact, thereby making the inverter INV compact.

Embodiment 6

A sixth embodiment of the present invention will be described with reference to FIG. 13.

Figure 13:
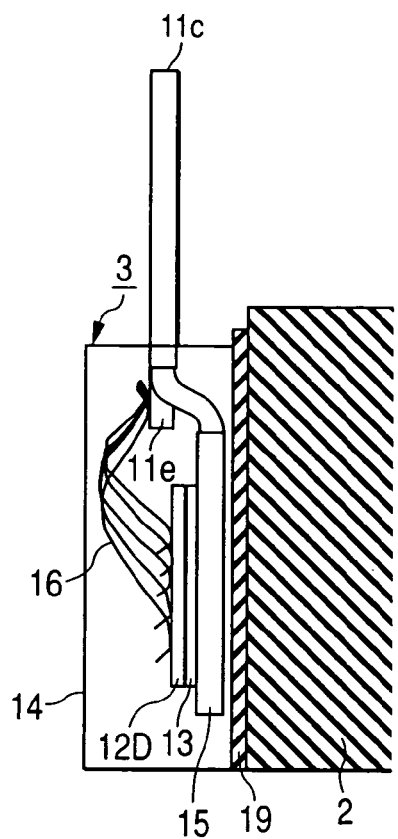
FIG. 13 is a drawing indicating a sixth embodiment of the present invention; it is a side cross sectional view indicating the structure of the semiconductor equipment mounted in the power module of the inverter in any one of the first to fifth embodiments.

FIG. 13 shows the structure of semiconductor equipment mounted in a power module unit PMU in an inverter INV in this embodiment.

This embodiment is an improvement of any one of the first to fifth embodiments described above; the heat dissipating grease 19 is applied between the bottom surface (heat dissipating surface which is one of the two main surfaces that is in the proximity to the heat dissipating plate 15) of the semiconductor equipment 3 and the side wall surfaces 2c or 2d. The heat dissipating grease 19 has a superior thermal conductivity. It may be applied to the surface contacts of other members.

The bottom surface (heat dissipating surface) of the semiconductor equipment 3 causes deformation such as warp and twist due to differences in physical properties between the plastic package 14 and other members such as the lead wires 11c, 11e, and 11g. The side wall surfaces 2c and 2d of the heat dissipating member 2 also cause concave and convex deformation during the manufacturing of the heat dissipating member 2. This generates air layers between the bottom surface (heat dissipating surface) of the semiconductor equipment 3 and the side wall surfaces 2c and 2d. In this embodiment, therefore, the heat dissipating grease 19 is applied between the bottom surface (heat dissipating surface) of the semiconductor equipment 3 and the side wall surfaces 2c and 2d so as to fill the air layers.

According to this embodiment, the heat dissipating grease 19 is applied between the bottom surface (heat dissipating surface) of the semiconductor equipment 3 and the side wall surfaces 2c and 2d, so the air layers formed between the bottom surface (heat dissipating surface) of the semiconductor equipment 3 and the side wall surfaces 2c and 2d can be filled. Accordingly, this embodiment can improve the contact between the bottom surface (heat dissipating surface) of the semiconductor equipment 3 and the side wall surfaces 2c and 2d, thereby further reducing the heat resistance between the bottom surface (heat dissipating surface) of the semiconductor equipment 3 and the side wall surfaces 2c and 2d.

Embodiment 7

A seventh embodiment of the present invention will be described with reference to FIG. 14.

Figure 14:
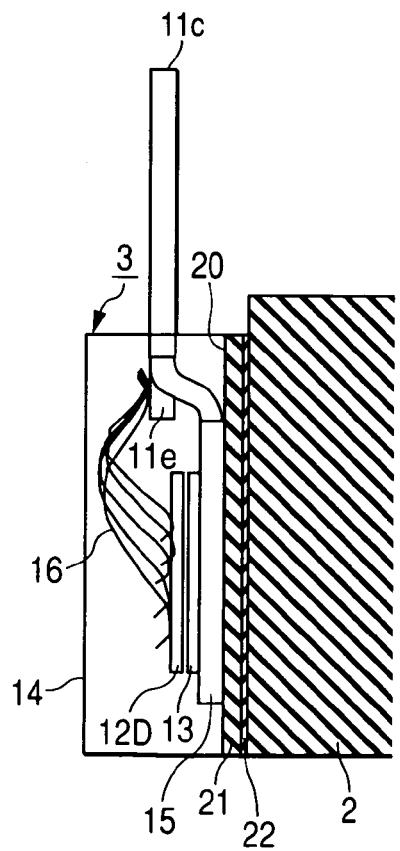
FIG. 14 is a drawing indicating a seventh embodiment of the present invention; it is a side cross sectional view indicating the structure of the semiconductor equipment mounted in the power module of the inverter in any one of the first to fifth embodiments.

FIG. 14 shows the structure of semiconductor equipment mounted in a power module unit PMU in an inverter INV in this embodiment.

This embodiment is an improvement of any one of the first to fifth embodiments described above; a bonding surface 20 is formed by causing the surface, facing the side wall surface 2c or 2d, of the heat dissipating plate 15 of the semiconductor equipment 3 to be exposed from the plastic package 14 so that the surface, facing the side wall surface 2c or 2d, of the heat dissipating plate 15 is made flush with the surface, facing the side wall surface 2c or 2d, of the plastic package 14. An insulating sheet 21 made of thermally conductive resin having a superior insulation property is fixed to the bonding surface 20 of the semiconductor equipment 3. A metal foil 22 is slightly applied to the surface, facing the side wall surface 2c or 2d, of the insulating sheet 21.

According to this embodiment, the heat dissipating surface (bottom surface) of the semiconductor equipment 3 is formed by the insulating sheet 21 on which the metal foil 22 is laminated, so the thickness of the heat dissipating surface (bottom surface) of the semiconductor equipment 3 can be adjusted. According to this embodiment, therefore, the insulating sheet 21 that electrically insulates the heat dissipating plate 15 from the side wall surface 2c or 2d can be thinned easily as necessary, thereby enabling the thermal resistance of the semiconductor equipment 3 to be reduced easily and further enhancing heat dissipation from the semiconductor equipment 3. Furthermore, according to this embodiment, the metal foil 22 laminated to the insulating sheet 21 prevents the insulating sheet 21 from being damaged when the semiconductor equipment 3 is attached to the heat dissipating member 2 and suppresses concentration of the electric field due to the concave and convex shapes on the side wall surfaces 2c and 2d, improving resistance to pressure.

In this embodiment, an insulating sheet 21 is formed by slightly applying thermally conductive resin to the bonding surface 20 of the semiconductor equipment 3. As another way of attaching the insulating sheet 21 to the bonding surface 20, the thermally conductive resin may be molded to a sheet-like shape before being fixed to the bonding surface 20. The metal foil 22 may also be applied to the insulating sheet 21 after the insulating sheet 21 is molded and before it is fixed to the bonding surface 20. Alternatively, the metal foil 22 may be applied to the insulating sheet 21 after the insulating sheet 21 is molded and then fixed to the bonding surface 20.

Embodiment 8

An eighth embodiment of the present invention will be described with reference to FIG. 15.

Figure 15:
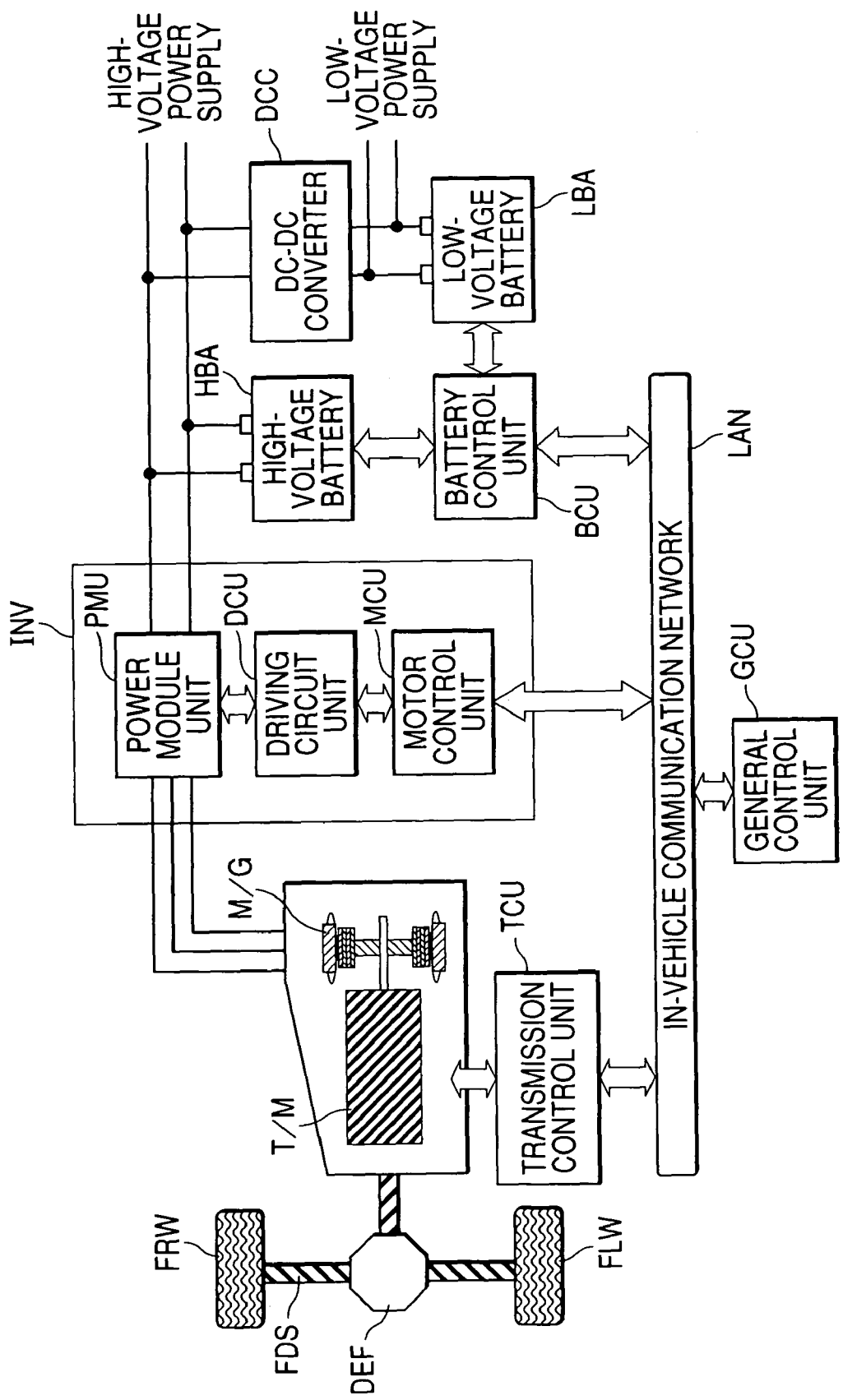
FIG. 15 is a drawing indicating an eighth embodiment of the present invention; it is a block diagram schematically indicating the structure of a power system of an electric vehicle in which the inverter in any one of the first to seventh embodiments is mounted as a control unit of a motor driving system.

FIG. 15 approximately shows the structure of a power system of an electric vehicle in this embodiment.

The power system of the electric vehicle in this embodiment is configured by removing the internal combustion engine from the hybrid electric vehicle in the first embodiment. The structure excluding the internal combustion engine is the same as that of the hybrid electric vehicle in the first embodiment. The operation of the electric vehicle is the same as the running operation only by the motor generator of the hybrid electric vehicle in the first embodiment and the regeneration operation by the motor generator.

The inverter INV is the same as the inverter INV in any one of the first to seventh embodiments described above.

According to this embodiment, the inverter INV in any one of the first to seventh embodiments is included as the driving control unit of the motor generator M/G of the electric vehicle, so a compact, reliable motor driving system can be provided at a low price for an electric vehicle.

Embodiment 9

A ninth embodiment of the present invention will be described with reference to FIG. 16.

Figure 16:
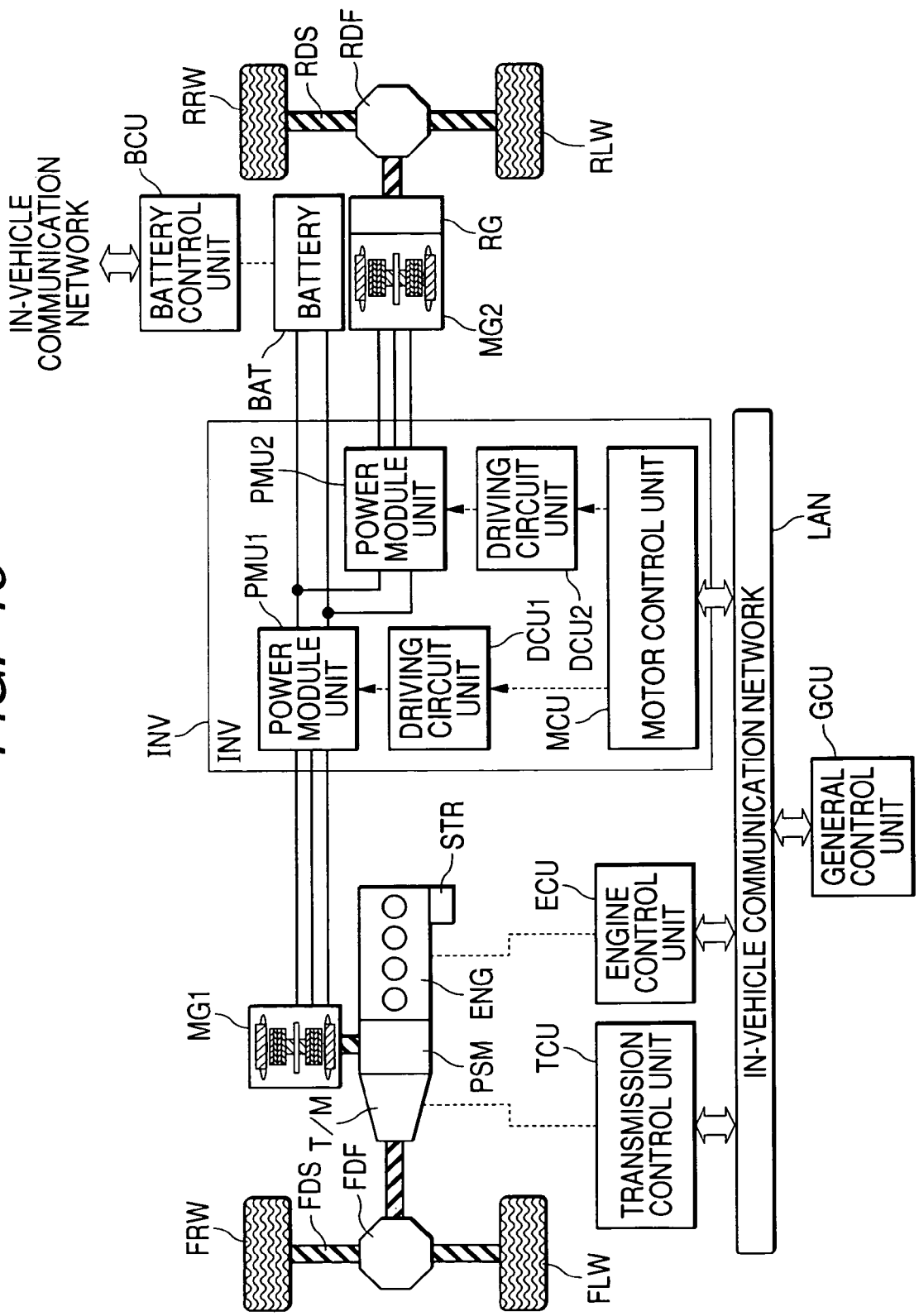
FIG. 16 is a drawing indicating a ninth embodiment of the present invention; it is a block diagram schematically indicating the structure of a power system of a four-wheel drive hybrid electric vehicle in which the inverter in any one of the first to seventh embodiments is mounted as a control unit of a motor driving system.

FIG. 16 approximately shows the structure of a power system of a four-wheel drive hybrid electric vehicle in this embodiment.

The hybrid electric vehicle in this embodiment is a four-wheel drive hybrid electric vehicle that is structured so that the front left wheel FLW and front right wheel FRW are driven by an internal combustion engine ENG and motor generator MG1, and the rear left wheel RLW and rear right wheel RRW are driven by a motor generator MG2. Although this embodiment will be described by using the engine ENG and motor generator MG1 to drive the front left wheel FLW and front right wheel FRW and using the motor generator MG2 to drive the rear left wheel RLW and rear right wheel RRW, the motor generator MG1 may be used to drive the front left wheel WFLW and front right wheel FRW and the engine ENG and motor generator MG2 may be used to drive the rear left wheel RLW and rear right wheel RRW.

The transmission T/M is mechanically connected to the front driving shafts FDSs of the front left wheel FLW and front right wheel FRW through the front differential gear FDF. The motor generator MG1 and engine ENG are mechanically connected to the transmission T/M through a power sharing mechanism PSM. The power sharing mechanism PSM combines and shares rotational driving forces. The AC side of the inverter INV is electrically connected to the stator windings of the motor generator MG1. The inverter INV is a power converter that converts DC power into three-phase AC power, which controls the driving of the motor generator MG1. A battery BAT is electrically connected to the DC side of the inverter INV.

The motor generator MG2 is mechanically connected to the rear driving shaft RDSs of the rear left wheel RLW and rear right wheel RRW through the rear differential gear RDF and reduction gear RG. The AC side of the inverter INV is electrically connected to the stator windings of the motor generator MG2. The inverter INV is used in common for the motor generators MG1 and MG2, which has a power module PMU1 and driving circuit unit DCU1 for the motor generator MG1 and a power module PMU2 and driving circuit unit DCU2 for the motor generator MG2, as well as a motor control unit MCU.

The engine ENG is equipped with a stator STR. The stator STR is a starting device that starts the engine ENG.

The engine control unit ECU calculates control values required to operate components (such as the throttle valve and fuel injection valve) of the engine ENG from input signals output from sensors and other control units. The calculated values are output to the driving units of the components of the engine ENG as control signals. The operations of the components of the engine ENG are thus controlled.

The operation of the transmission T/M is controlled by the transmission control unit TCU. The transmission control unit TCU calculates control values required to operate the gearbox mechanism from input signals output from sensors and other control units. The control values are output to the driving unit of the gearbox mechanism as control signals. The operation of the gearbox mechanism of the transmission T/M is thus controlled.

The battery BAT is a high-voltage lithium-ion battery, the battery voltage of which is 200 V or higher. Its charging and discharging and life are managed by the battery control unit BCU. For the management of the battery's charging and discharging and life, the voltage and current values and other data of the battery BAT are input to the battery control unit BCU. A low-voltage battery (not shown), the battery voltage of which is 12 V, is also mounted. It is used as the power supply for the control system, radio, lights, and the like.

The engine control unit ECU, transmission control unit TCU, motor control unit MCU, and battery control unit BCU are interconnected through an in-vehicle local area network LAN. They are also electrically connected to the general control unit GCU. Accordingly, bi-directional signal transmission becomes possible between control units, enabling mutual information transfer and the sharing of detected values.

The general control unit GCU outputs command signals to the control units according to the operation status of the vehicle. For example, the general control unit GCU calculates the amount of torque necessary for the vehicle according to the amount of gas pedal displacement responsive to an acceleration request made by a driver, and divides the necessary amount of torque into an output torque value on the engine ENG side and an output torque value on the motor generator MG1 side so that the operation efficiency of the engine ENG is improved. The divided output torque value on the engine ENG side is output to the engine control unit ECU as an engine torque command signal, while the divided output torque value on the motor generator MG1 side is output to the motor control unit MCU as a motor torque command signal.

The inverter INV is the same as the inverter INV in any one of the first to seventh embodiments described above.

The motor generators MG1 and MG2 each use a permanent magnetic AC synchronous rotating electric machine that generates rotational torque from the electromagnetic effect induced by the stator iron core equipped with stator windings and the permanent magnet of the rotator.

Next, the operation of the hybrid vehicle in this embodiment will be described.

When the hybrid electric vehicle starts or is running at low speed (in a range in which the operation efficiency (fuel economy) of the engine ENG is low), the front wheels FLW and FRW are driven by the motor generator MG1. In the description of this embodiment, when the hybrid electric vehicle starts or is running at low speed, the motor generator MG1 is used to drive the front wheels FLW and FRW. In addition to using motor generator MG1 to drive the front wheels FLW and FRW, however, the motor generator MG2 may be used to drive the rear wheels RLW and RRW (four-wheel driving may be carried out). DC power is supplied from the battery BAT to the inverter INV. The supplied DC power is converted by the inverter INV into three-phase AC power. The three-phase AC power thus obtained is supplied to the stator windings of the motor generator MG1. The motor generator MG1 is then driven and generates rotational output. The rotational output is supplied to the transmission T/M through the power sharing mechanism PSM. The speed of the supplied rotational output is changed by the transmission T/M and supplied to the front differential gear FDF. The supplied rotational output is shared to the right and left by the front differential gear FDF and transmitted to the front driving shafts FDSs on the right and left. The front driving shafts FDSs are then rotated. The rotation of the front driving shafts FDSs then rotates the front wheels FLW and FRW.

When the hybrid electric vehicle is in the normal running state (it runs on a dry road in a range in which the operation efficiency (fuel economy) of the engine ENG is high), the front wheels FLW and FRW are driven by the engine ENG. To do this, the rotational output of the engine ENG is supplied to the transmission T/M through the power sharing mechanism PSM. The speed of the supplied rotational output is changed by the transmission T/M. The rotational output after the speed change is transmitted to the front driving shafts FDSs through the front differential gear FDF. Then the front wheels FLW and FRW are rotated. When the charge state of the battery BAT is detected, if the battery BAT needs to be charged, the rotational output of the engine ENG is shared to the motor generator MG1 through the power sharing mechanism PSM to rotate the motor generator MG1. The motor generator MG1 then operates as a power generator, which generates three-phase AC power in the stator windings of the motor generator MG1. The generated three-phase AC power is converted by the inverter INV to prescribed DC power. The DC power obtained by the conversion is supplied to the battery BAT. Accordingly, the battery BAT is charged.

When the hybrid electric vehicle drives the four wheels (it runs on a snowy road or another road having a low friction coefficient μ in a range in which the operation efficiency (fuel economy) of the engine ENG is high), the rear wheels RLW and RRW are driven by the motor generator MG2. At the same time, as in the normal running described above, the front wheels FLW and FRW are driven by the engine ENG. Since the charge of the battery BAT is reduced as the motor generator MG1 drives, the rotational output of the engine ENG is used to rotate the motor generator MG1 so as to charge the battery BAT. To drive the rear wheels RLW and RRW by the motor generator MG2, DC power is supplied from the battery BAT to the inverter INV. The supplied DC power is converted by the inverter INV into three-phase AC power. The three-phase AC power obtained by this conversion is supplied to the stator windings of the motor generator MG2. The motor generator MG2 is then driven and generates rotational output. The speed of the generated rotational output is reduced by the reduction gear RG and supplied to the rear differential gear RDF. The supplied rotational output is shared to the right and left by the rear differential gear RDF and transmitted to the rear driving shafts RDSs on the right and left. The rear driving shafts RDSs are then rotated. The rotation of the rear driving shafts RDSs then rotates the rear wheels RLW and RRW.

When the hybrid electric vehicle is accelerated, the front wheels FLW and FRW are driven by the engine ENG and motor generator MG1. In the description of this embodiment, when the hybrid electric vehicle is accelerated, the engine ENG and motor generator MG1 are used to drive the front wheels FLW and FRW. In addition to using the engine ENG and motor generator MG1 to drive the front wheels FLW and FRW, however, the motor generator MG2 may be used to drive the rear wheels RLW and RRW (four-wheel driving may be carried out). The rotational output of the engine ENG and motor generator MG1 is supplied to the transmission T/M through the power sharing mechanism PSM. The speed of the supplied rotational output is changed by the transmission T/M. The rotational output after the speed change is transmitted to the front driving shafts FDSs through the front differential gear FDF. The front wheels FLW and FRW then rotate.

During the regeneration of the hybrid electric vehicle (when the speed is reduced by, for example, pressing the brake pedal, easing up the gas pedal, or releasing the gas pedal), the rotational force of the front wheels FLW and FRW is transmitted to the motor generator MG1 through the front driving shafts FDSs, front differential gear FDF, transmission T/M, and the power sharing mechanism PSM to rotate the motor generator MG1. The motor generator MG1 then operates as a power generator, which generates three-phase AC power in the stator windings of the motor generator MG1. The generated three-phase AC power is converted by the inverter INV to prescribed DC power. The DC power obtained by the conversion is supplied to the battery BAT. Accordingly, the battery BAT is charged. The rotational force of the rear wheels RLW and RRW is transmitted to the motor generator MG2 through the rear driving shafts RDSs, rear differential gear RDF, and reduction gear RG to rotate the motor generator MG2. The motor generator MG2 then operates as a power generator, which generates three-phase AC power in the stator windings of the motor generator MG2. The generated three-phase AC power is converted by the inverter INV to prescribed DC power. The DC power obtained by the conversion is supplied to the battery BAT. Accordingly, the battery BAT is charged.

According to this embodiment, the inverter INV in any one of the first to seventh embodiments is included as the driving control unit of the motor generators MG1 and MG2 of a four-wheel drive hybrid electric vehicle, so a compact, highly reliable motor driving system for a four-wheel drive hybrid electric vehicle can be provided at a low price.

In the description of this embodiment, a four-wheel drive hybrid electric vehicle that drives the motor generators MG1 and MG2 by using power from the battery BAT has been used as an example. Another four-wheel drive hybrid electric vehicle may drive the front wheels (or rear wheels) by an engine and drive the rear wheels (or front wheels) by a motor. When this type of four-wheel drive hybrid electric vehicle is used, instead of the above motor generator MG1 and battery BAT, a power generator driven by the engine ENG is included, which is specific to driving and can output a higher DC power (50 V) than the auxiliary power generator that outputs DC power for the 14-V vehicle-mounted auxiliaries, and can change the output in the range from 0 V to 50 V. The output from the power generator is supplied directly to the DC side of the inverter INV. The inverter INV controls the driving of the motor and drives the rear wheels (or front wheels). The inverter INV in any one of the first to seventh embodiments described above may be used as the inverter INV of this type of four-wheel drive hybrid electric vehicle. The motor that drives the rear wheels uses a field-wiring-type synchronous rotating electric machine that generates rotational torque from the electromagnetic effect induced by a stator iron core equipped with stator windings and a Rundel rotator having field windings around a pair of claw-type magnetic pole iron cores.

Embodiment 10

A tenth embodiment of the present invention will be described with reference to FIG. 17.

Figure 17:
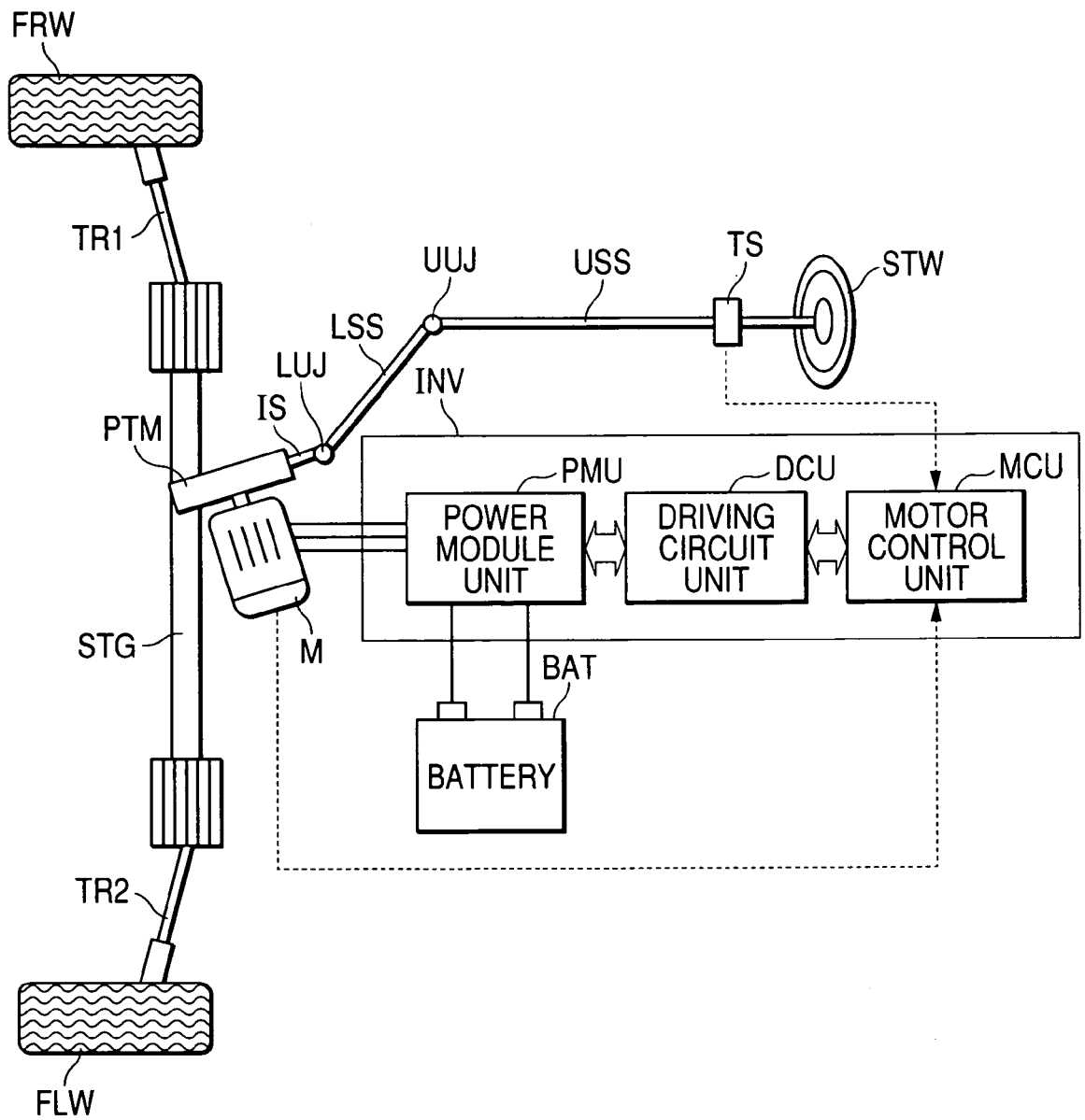
FIG. 17 is a drawing indicating a tenth embodiment of the present invention; it is a block diagram schematically indicating the structure of an electric power steering system in which the inverter in any one of the first to seventh embodiments is mounted as a control unit of a motor driving system.

FIG. 17 approximately shows the structure of an electric power steering system in this embodiment.

The electric power steering system (referred to below as the EPS system) in this embodiment is a pinion-type EPS system (referred to below as the P-EPS system), which uses an electric power steering motor M (referred to below as the EPS motor M) provided near the steering gear STG to assist the pinion gear.

EPS systems include column-type EPS systems that use an EPS motor provided near the column shaft to assist the column shaft and rack cross EPS systems that use an EPS motor provided near the steering gear to assist the rack. The power supply and actuator structure in the P-EPS system in this embodiment can also be applied to these EPS systems.

When a driver rotates the steering wheel STW, its main steering force (rotational force) is transmitted to the steering gear STG through the upper steering shaft USS, upper universal joint UUJ, lower steering shaft LSS, and lower universal joint LUJ. The auxiliary steering force (rotational force) output from the EPS motor M is also transmitted to the steering gear STG.

The steering gear STG is a mechanism that receives the main steering force (rotational force) and auxiliary steering force (rotational force), converts the forces into linear reciprocating forces, and transmits them to the right and left tie rod TR1 and TR2. The steering gear STG comprise a rack shaft (not shown) on which a rack gear (not shown) is provided and a pinion shaft (not shown) on which a pinion gear (not shown) is provided. The rack gear is engaged with the pinion gear in the power transformer PTM in which rotational force is transformed into linear reciprocating force. The main steering force is transmitted to the pinion shaft through the input shaft IS in the power transformer PTM. The auxiliary steering force is transmitted to the pinion shaft through the reduction mechanism (not shown) in the power transformer PTM.

The steering force transformed by the steering gear STG into the linear reciprocating force is transmitted to the tie rods TR1 and TR2 linked to the rack shaft. The steering force is then transmitted from the tie rods TR1 and TR2 to the wheels FRW and FLW on the right and left. Accordingly, the wheels FRW and FRW are steered.

A torque sensor TS is provided on the upper steering shaft USS. The torque sensor TS detects a steering force (rotational torque) given to the steering wheel STW.

The EPS motor M is controlled by a control unit. The EPS motor M and control unit constitute the actuator in the EPS system. The EPS system uses the battery BAT mounted on the vehicle as the power supply. The control unit is the inverter INV, which, according to the output from the torque sensor TS, converts DC power supplied from the battery BAT to multi-phase AC power so that the output torque of the EPS motor M becomes the target torque, and supplies the converted AC power to the EPS motor M. The inverter INV is the same as the inverter INV in any one of the first to seventh embodiments described above. The EPS motor M uses a permanent magnetic AC synchronous rotating electric machine that generates rotational torque from the electromagnetic effect induced by the stator iron core equipped with stator windings and the permanent magnet of the rotator.

According to this embodiment, the inverter INV in any one of the first to seventh embodiments is included as the control unit of the EPS motor M in the EPS system, so a compact, highly reliable motor driving system can be provided at a low price for the EPS system.

Embodiment 11

An eleventh embodiment of the present invention will be described with reference to FIG. 18.

Figure 18:
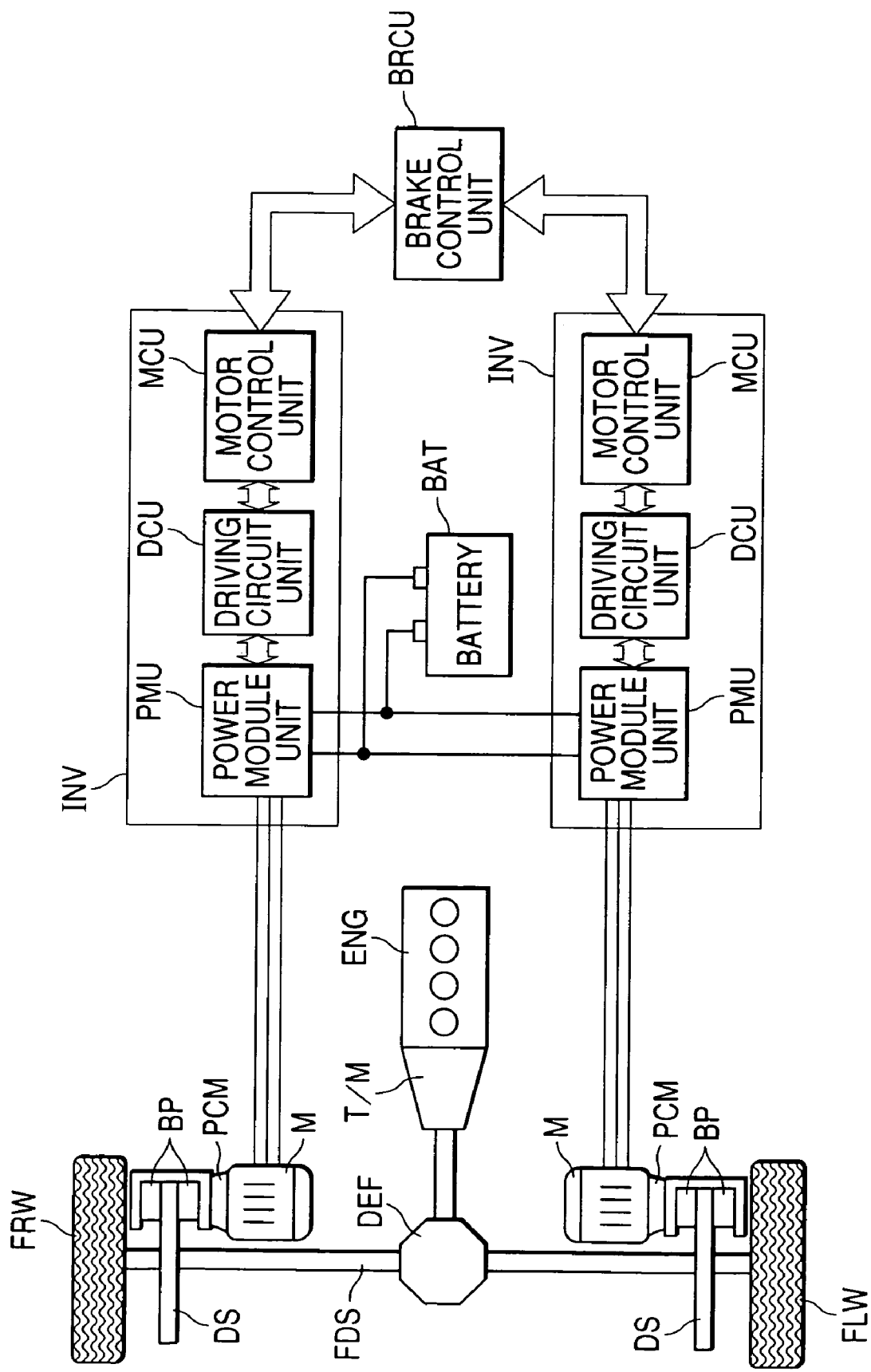
FIG. 18 is a drawing indicating an eleventh embodiment of the present invention; it is a block diagram schematically indicating the structure of an electric brake system in which the inverter in any one of the first to seventh embodiments is mounted as a control unit of a motor driving system.

FIG. 18 approximately shows the structure of an electric brake system in this embodiment.

The vehicle on which the electric brake system (referred to below as the EB system) in this embodiment is mounted is a front-wheel drive vehicle, which transmits the driving force output from the internal combustion engine ENG to the front driving shaft FDSs through the transmission T/M and differential gear DEF, rotates the front wheels FLW and FRW, and runs the vehicle. The EB system in this embodiment is provided at each of the front wheels FRW and FLW on the right and left.

In the description of this embodiment that follows, EB systems are installed on the front wheels. The EB systems, however, may be installed on either the front wheels or rear wheels.

A disk rotor DS is provided on the front driving shaft FDS. The disk rotor DS rotates together with the front driving shaft FDS. At both ends of the disk rotor DS, brake pads BPs are provided on carriers (not shown), which are movably supported in the axial direction. The disk pads BPs are installed in such a way that they clamp the rotational surfaces on both sides of the disk rotor DS. Braking force is generated when the brake pads BPs press the rotational surfaces on both sides of the disk rotor DS.

The brake pads BPs are rotated by the rotational torque of the motor M. The rotational torque of the motor M is transformed by a power conversion mechanisms PCM into linear power. The liner power is given to a piston (not shown) that is movably supported by a supporting mechanism (not shown) as the propelling force. When the piston is propelled, the brake pads BPs operate and press the rotational surfaces on both sides of the disk rotor DS. The motor M uses a permanent magnetic AC synchronous rotating electric machine that generates rotational torque from the electromagnetic effect induced by the stator iron core equipped with stator windings and the permanent magnet of the rotator.

The motor M is controlled by a control unit. The motor M and control unit constitute the actuator in the EB system. The EB system uses the battery BAT mounted on the vehicle as the power supply. The control unit is the inverter INV, which, according to a torque command from a brake control unit BRCU, converts DC power supplied from the battery BAT to multi-phase AC power so that the output torque of the motor M becomes the target torque, and supplies the converted AC power to the motor M. The inverter INV is the same as the inverter INV in any one of the first to seventh embodiments described above.

The brake control unit BRCU receives signals indicating the amount of brake pedal depression, the vehicle operation state, and other states, calculates braking forces necessary for the front wheels FLW and FRW according to the received signals, transforms the calculated necessary braking forces into torque values commanded for the motors M, and output to the inverters INVs.

According to this embodiment, the inverter INV in any one of the first to seventh embodiments is included as the control unit of the motor M in the EB system, so a compact, highly reliable motor driving system can be provided at a low price for the EB system.

Embodiment 12

A twelfth embodiment of the present invention will be described with reference to FIG. 19.

Figure 19:
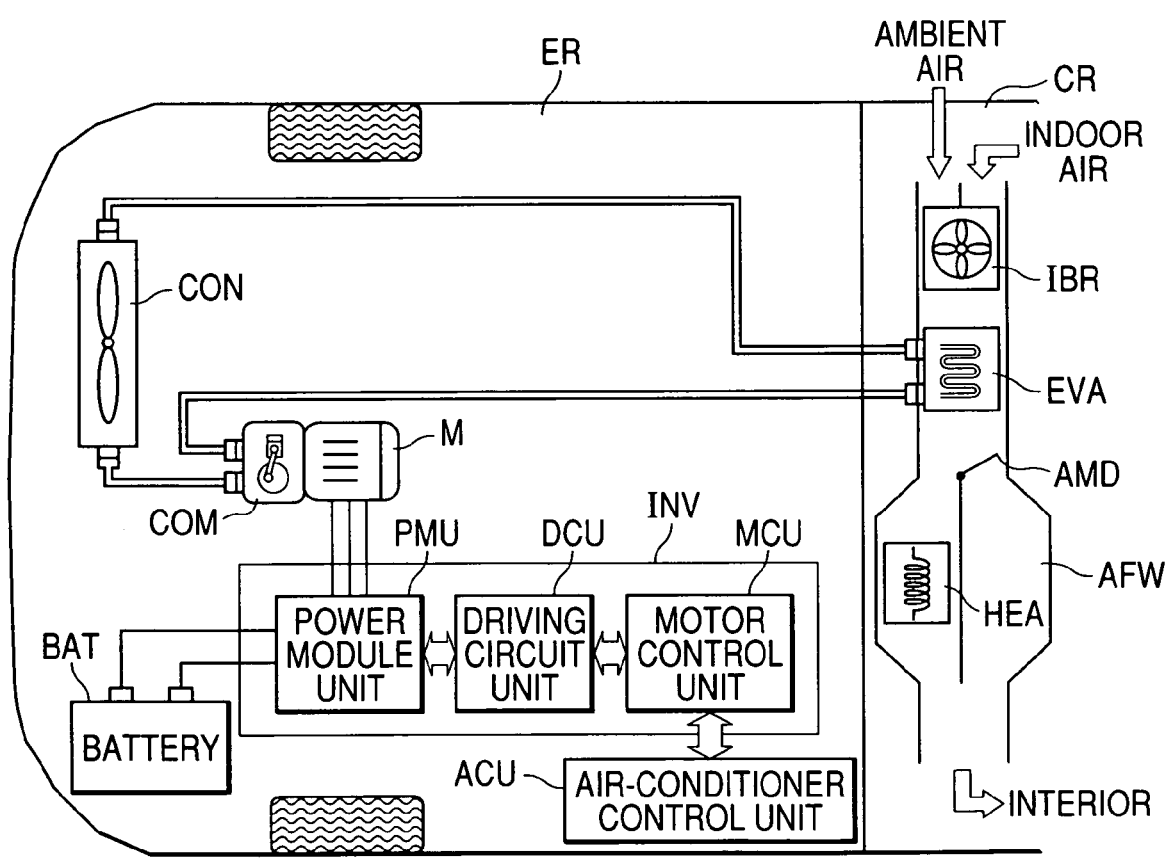
FIG. 19 is a drawing indicating a twelfth embodiment of the present invention; it is a block diagram schematically indicating the structure of an electric air-conditioning power system in which the inverter in any one of the first to seventh embodiments is mounted as a control unit of a motor driving system.

FIG. 19 approximately shows the structure of a car air-conditioner (car air-conditioning system) in this embodiment.

An engine room ER is provided at the front of the body of a car. A car room CR, which is separated from the engine room ER, is provided behind the engine room ER. The engine room ER accommodates components required to drive the car, some components in the air conditioner, and the like. The car room CR accommodates a driver, who sits on the driver's seat and manipulates the handle as well as fellow passenger who sit on the passenger seat and rear seats. Some components in the air conditioner are accommodated in the car room CR (specifically, below the dashboard on the engine room ER side.

In the engine room ER, a compressor COM, which compresses the air-conditioning coolant of the air-conditioner, is mounted. A motor M is integrally mounted in the compressor COM. The rotational driving force, which is the output of the motor M, is supplied (transmitted) to the compressor COM, rotating the compressor COM. The air-conditioning coolant compressed by the compressor COM is supplied to the condenser CON through an exhaust pipe. The condenser CON cools the gaseous, high-temperature, high-pressure air-conditioning coolant compressed by the compressor COM with the ambient air for condensation.

An evaporator EVA constituting a cooling unit is provided in the car room CR. The evaporator EVA is disposed within an air flow passage AFW, which evaporates the air-conditioning coolant supplied from the condenser CON through a pipe to cool the air. An intake blower IBR is disposed upstream of the evaporator EVA within the air flow passage AFW. The intake blower IBR blows the ambient air or indoor air into the air flow passage AFW. A heater unit HEA is disposed downstream of the evaporator EVA within the air flow passage AFW. The heater unit HEA warms the air that has been cooled by the evaporator EVA.

When the air (ambient air or indoor air) is blown into the air flow passage AFW by the intake blower IBR, the air is cooled by the evaporator EVA. The cooled air flows into the air flow passage AFW toward the heater unit HEA. An air mixing door AMD is provided between the evaporator EVA and heater unit HEA within the air flow passage AFW. The air mixing door AMD controls the flow rate of the air that is supplied to the heater unit HEA and the flow rate of the air that bypasses the heater unit HEA so that the air cooled by the evaporator is branched. The air branched into the heater unit HEA is warmed by the heater unit HEA, and then is mixed with the air that has bypassed the heater unit HEA. Accordingly, the temperature of the air to be supplied into the car room CR is controlled. The mixed air is blown into the car room CR from any of a plurality of air outlets provided in the car room CR. This causes the temperature in the car room CR to be controlled to a preset temperature.

The air-conditioning coolant evaporated by the evaporator EVA is supplied to the compressor COM through an intake pipe and then compressed. The compressed air-conditioning coolant is supplied to the condenser CON through a discharge pipe and then liquefied. The liquefied air-conditioning coolant is supplied to the evaporator EVA through the pipe and then evaporated. In the air-conditioner, the freezing cycle is repeated. The discharge pipe, pipe, and intake pipe are metallic pipes or flexible pipes.

The motor M is controlled by a control unit. The motor M and control unit constitute the actuator in the air-conditioning system. The air-conditioning system uses the battery BAT mounted on the vehicle as the power supply. The control unit is the inverter INV, which, according to a rotational speed command from an air-conditioner control unit ACU, converts DC power supplied from the battery BAT to multi-phase AC power so that the output rotational speed of the motor M becomes the target rotational speed, and supplies the converted AC power to the motor M. The inverter INV is the same as the inverter INV in any one of the first to seventh embodiments described above.

The air-conditioner control unit ACU receives signals indicating the temperature preset by the driver, the temperature detected in the car room CR, and other states, decides whether to operate or stop the compressor COM from the received signals, and outputs the rotational speed necessary for operating the compressor COM to the inverter INV as a command value according to the decision.

According to this embodiment, the inverter INV in any one of the first to seventh embodiments is included as the control unit of the motor M in the air-conditioning system, so a compact, highly reliable motor driving system can be provided at a low price for air-conditioning EB system.

In the first to twelfth embodiments described above, a battery has been used as the DC power supply, but fuel cells may be used as the DC power supply.

What is claimed is:

1. An electric circuit module, comprising:
    a plurality of semiconductor components;
    a heat dissipating member comprising a main body portion and configured to cool the plurality of the semiconductor components which are disposed along inner side walls formed in a long and slender recess located centrally of the main body portion;
    a U-shaped fixing tool comprised of pressing parts and a connection part between the pressing parts that are arranged between the semiconductor components so that the pressing parts are elastically urged toward each other to push the semiconductor components against the respective inner side wall upon the fixing tool being installed along a longitudinal direction of said recess;
    a DC positive-side wiring member and a DC negative-side wiring member so arranged so as to stand along opposite inner side walls of said first fixing tool; and
    a fixing component so inserted between said DC positive-side wiring member and said DC negative-side wiring member to elastically fill a space between said both wiring members; wherein
    a group of the semiconductor components is arranged on one side in said recess of said heat dissipating member is electrically connected to said DC positive-side wiring member, and another group of the semiconductor components is arranged on another side in said recess of said heat dissipating member are electrically connected to said DC negative-side wiring member.

2. The electric circuit module according to claim 1, wherein said fixing component has elastic power and pushes said both wiring members against both the inner side wall of said first fixing tool, respectively.

3. The electric circuit module according to claim 1, further comprising a second fixing tool which covers the open part of said recess of said heat dissipating member.

* * * * *